United States Patent
Jang et al.

(10) Patent No.: US 11,721,568 B2
(45) Date of Patent: Aug. 8, 2023

(54) SUBSTRATE TRANSFER APPARATUS

(71) Applicant: SAMSUNG ELECTRONICS CO., LTD., Suwon-si (KR)

(72) Inventors: Sangho Jang, Cheonan-si (KR); Dongsoo Lee, Cheonan-si (KR); Anhi Pyun, Asan-si (KR); Jinyi Lee, Asan-si (KR); Sukbyung Chae, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 413 days.

(21) Appl. No.: 16/996,116

(22) Filed: Aug. 18, 2020

(65) Prior Publication Data
US 2021/0193491 A1 Jun. 24, 2021

(30) Foreign Application Priority Data
Dec. 18, 2019 (KR) ................. 10-2019-0170205

(51) Int. Cl.
*B65G 47/52* (2006.01)
*B65G 15/14* (2006.01)
(Continued)

(52) U.S. Cl.
CPC ........ *H01L 21/67259* (2013.01); *B65G 15/14* (2013.01); *B65G 27/16* (2013.01);
(Continued)

(58) Field of Classification Search
None
See application file for complete search history.

(56) References Cited

U.S. PATENT DOCUMENTS

| 6,694,220 | B1 * | 2/2004 | Tanz ................. | B65G 43/08 |
| | | | | 700/226 |
| 10,081,495 | B2 * | 9/2018 | Møller ................. | B65G 35/06 |
| 2008/0159833 | A1 | 7/2008 | Lee et al. | |

FOREIGN PATENT DOCUMENTS

| JP | 2010-155683 | 7/2010 |
| KR | 10-1156063 | 6/2012 |
| (Continued) | | |

*Primary Examiner* — Kavel Singh
(74) *Attorney, Agent, or Firm* — F. Chau & Associates, LLC

(57) ABSTRACT

The present disclosure relates to a substrate transfer apparatus. The substrate transfer apparatus includes a first transfer apparatus, a second transfer apparatus, a substrate carrier driver, a sensor, a swing apparatus, and a controller. The first transfer apparatus is configured to transfer a substrate in a first direction. The second transfer apparatus is configured to receive the substrate from the first transfer apparatus and transfer the substrate and comprising a substrate carrier on which the substrate transferred from the first transfer apparatus is seated. The substrate carrier driver is configured to move the substrate carrier. The sensor is configured to detect an abnormal transfer of the substrate from the first transfer apparatus to the second transfer apparatus and generate a detection signal corresponding to the abnormal transfer of the substrate. The swing apparatus is configured to swing the substrate carrier. The controller is connected to the sensor and the swing apparatus and configured to control the swing apparatus based on the detection signal of the sensor.

14 Claims, 21 Drawing Sheets

(51) Int. Cl.
  *B65G 27/16* (2006.01)
  *B65G 39/18* (2006.01)
  *H01L 21/67* (2006.01)
  *B65G 41/00* (2006.01)
  *H01L 21/677* (2006.01)

(52) U.S. Cl.
  CPC ........... *B65G 39/18* (2013.01); *B65G 41/002* (2013.01); *B65G 47/52* (2013.01); *H01L 21/67288* (2013.01); *H01L 21/67706* (2013.01); *H01L 21/67718* (2013.01); *B65G 2203/0208* (2013.01); *B65G 2203/042* (2013.01); *B65G 2203/044* (2013.01)

(56) References Cited

FOREIGN PATENT DOCUMENTS

| | | |
|---|---|---|
| KR | 10-1164595 | 7/2012 |
| KR | 10-1230509 | 1/2013 |
| KR | 10-1234600 | 2/2013 |
| KR | 10-1312495 | 9/2013 |
| KR | 10-1395570 | 5/2014 |
| KR | 10-1397106 | 5/2014 |
| KR | 10-1416593 | 7/2014 |
| KR | 10-1545260 | 8/2015 |
| KR | 10-1566301 | 10/2015 |

\* cited by examiner

SUBSTRATE TRANSFER APPARATUS

CROSS-REFERENCE TO RELATED APPLICATION

This application claims the benefit of Korean Patent Application No. 10-2019-0170205, filed on Dec. 18, 2019, in the Korean Intellectual Property Office, the disclosure of which is incorporated by reference herein in its entirety.

BACKGROUND

The inventive concept relates to a substrate transfer apparatus, and more particularly, to a substrate transfer apparatus capable of transferring a warped substrate.

In semiconductor manufacturing, substrate transferring is the process used to move a substrate to and from various locations or machines during the manufacturing process. For example, a substrate transferring apparatus may transfer the substrate to and from various chambers for stepwise treatment of the substrate surface.

Semiconductor devices are then formed on the substrate in a complex process with numerous variables. The substrate transfer apparatus may include devices such as a transfer roller and a conveyor belt with small corners or rolling edges. In some cases, the substrate may be provided to the substrate transfer apparatus in a warped state, causing the substrate to be caught or snagged in the substrate transfer apparatus.

Therefore, there is a need in the art for a substrate transferring process that is capable of handling a warped substrate when transferring the substrate to and from different locations of the manufacturing process.

SUMMARY

The inventive concept provides a substrate transfer apparatus capable of preventing a substrate catching phenomenon, improving a substrate transfer speed, and reducing a risk of damage to a substrate. According to some embodiments, the inventive concept provides a substrate transfer apparatus capable of reducing warpage of a substrate.

The inventive concept provides a substrate transfer apparatus capable of reducing the abnormal transfer of a substrate by temporarily reducing warpage of the substrate when the substrate is transferred from a first transfer apparatus to a second transfer apparatus.

According to an aspect of the inventive concept, there is provided a substrate transfer apparatus including a first transfer apparatus configured to transfer a substrate in a first direction; a second transfer apparatus configured to receive the substrate from the first transfer apparatus, the second transfer apparatus comprising a substrate carrier configured to support the substrate and a substrate carrier driver configured to move the substrate carrier; a sensor configured to detect an abnormal transfer of the substrate from the first transfer apparatus to the second transfer apparatus and generate a detection signal corresponding to the abnormal transfer of the substrate; a swing apparatus configured to swing the substrate carrier; and a controller connected to the sensor and the swing apparatus and configured to control the swing apparatus based on the detection signal of the sensor.

According to another aspect of the inventive concept, there is provided a substrate transfer apparatus including a plurality of first rotation shafts; a main transfer roller coupled to each of the first rotation shafts, configured to move a substrate in a first direction, and comprising a plurality of guide portions spaced apart in a second direction perpendicular to the first direction and configured to prevent the substrate from being separated, and a transfer portion between the plurality of guide portions and configured to contact the substrate and transfer the substrate in the first direction; a camshaft disposed between the first rotation shafts; a rotation driver configured to rotate the camshaft; and an eccentric cam coupled to the camshaft and configured to raise or lower the substrate in a vertical direction, and wherein a guide distance formed by the plurality of guide portions of the main transfer roller in the second direction gradually decreases toward the first direction.

According to another aspect of the inventive concept, there is provided a substrate transfer apparatus for transferring a substrate in a first direction including: a first lower conveyor belt including: a first lower rotation shaft; a second lower rotation shaft spaced apart from the first lower rotation shaft in the first direction and configured to rotate in the same direction as that of the first lower rotation shaft; and a first lower transfer belt configured to connect the first lower rotation shaft to the second lower rotation shaft and contacting at least a part of a lower surface of the substrate; and a first upper conveyor belt disposed above first lower conveyor belt and including a first upper rotation shaft; a second upper rotation shaft spaced apart from the first upper rotation shaft in the first direction and configured to rotate in the same direction as that of the first upper rotation shaft; and a first upper transfer belt configured to connect the first upper rotation shaft to the second upper rotation shaft and contacting at least a part of an upper surface of the substrate, and wherein the first lower conveyor belt and the first upper conveyor belt are configured to cooperate to transfer the substrate in the first direction, and the first lower transfer belt and the first upper transfer belt are spaced apart with a transfer path of the substrate therebetween.

According to another aspect of the inventive concept, a method of transferring a substrate is described. The method may include moving a substrate from a first portion of a substrate transferring apparatus toward a second portion of the substrate transferring apparatus; detecting an abnormal transfer from the first portion of the substrate transferring apparatus toward the second portion of the substrate transferring apparatus; generating an abnormal transfer signal based on detecting the abnormal transfer; adjusting the substrate transferring apparatus based on the abnormal transfer signal; and moving the substrate to the second portion of the substrate transferring apparatus based on adjusting the substrate transferring apparatus.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

The present disclosure relates to semiconductor manufacturing. More specifically, embodiments of the present disclosure provide a substrate transfer apparatus capable of preventing a substrate catching phenomenon. A substrate transfer apparatus according to the present disclosure may include a sensor sensing abnormal transfer of the substrate and a swing or other component used to move the transfer apparatus when an abnormal transfer signal is provided by the sensor. Some embodiments of transfer apparatus may also include a mechanism that contacts the upper and lower portions of the substrate to mitigate warping when a warped substrate is transferred.

For example, the substrate transfer apparatus of the present disclosure may include a roller having a narrow guide distance in the transfer direction of the substrate. The substrate may be automatically aligned while being transferred. Additionally or alternatively, the substrate transfer device may include a cam device. The cam may raise the substrate when the substrate is caught in the substrate transfer apparatus. In some embodiments, a conveyor belt in front of the transfer roller may be used. Additionally or alternatively, the conveyor belt may be inclined upward. As a result, the conveyor belt may transfer the substrate to the transfer roller when the substrate is warped.

Accordingly, embodiments of the substrate transfer apparatus may include a first transfer apparatus, a second transfer apparatus, a substrate carrier driver, a sensor, a swing apparatus, and a controller. The first transfer apparatus is configured to transfer a substrate in a first direction. The second transfer apparatus is configured to receive the substrate from the first transfer apparatus and transfer the substrate and comprising a substrate carrier on which the substrate transferred from the first transfer apparatus is seated. The substrate carrier driver is configured to move the substrate carrier. The sensor is configured to detect an abnormal transfer of the substrate from the first transfer apparatus to the second transfer apparatus and generate a detection signal corresponding to the abnormal transfer of the substrate. The swing apparatus is configured to swing the substrate carrier. The controller is connected to the sensor and the swing apparatus and configured to control the swing apparatus based on the detection signal of the sensor.

Hereinafter, embodiments of the inventive concept will be described in detail with reference to the accompanying drawings.

Figure 1:
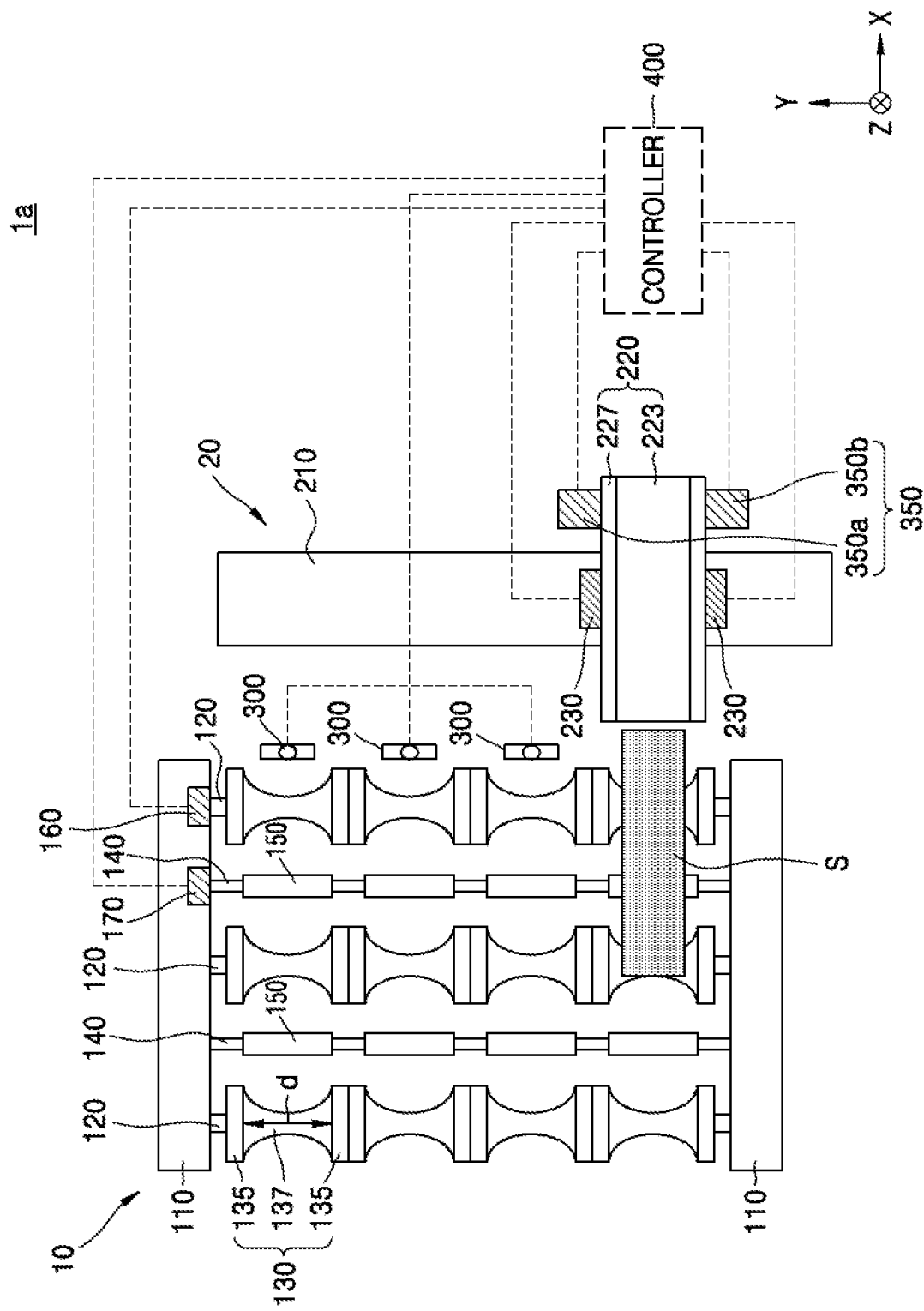
FIG. 1 is a plan view of a first substrate transfer apparatus according to an example embodiment.

FIG. 1 is a plan view of a first substrate transfer apparatus 1*a* according to an example embodiment. The first substrate transfer apparatus 1*a* may be an apparatus for transferring a substrate S in a first direction X. The first substrate transfer apparatus 1*a* may transfer the substrate S in the first direction X. For example, the first substrate transfer apparatus 1*a* may transfer the substrate S for a process of processing the substrate S, such as a wire bonding process, a semiconductor chip attaching process, a molding process, a solder ball attaching process, etc. Additionally or alternatively, the first substrate transfer apparatus 1*a* may transfer the substrate S for carrying in or out the substrate S into or from a chamber. The substrate S transferred by the first substrate transfer apparatus 1*a* may include a wafer, a printed circuit board, or the like.

Referring to FIG. 1, the first substrate transfer apparatus 1*a* may include a first transfer apparatus 10, a second transfer apparatus 20, a sensor 300, a swing apparatus 350, and a controller 400.

In an example embodiment, the first transfer apparatus 10 may include a supporter 110, a first rotation shaft 120, a main transfer roller 130, a second rotation shaft 140, an auxiliary transfer roller 150, a first rotation driver 160, and a second rotation driver 170.

The first transfer apparatus 10 may transfer the substrate S to the second transfer apparatus 20. The first transfer apparatus 10 may provide a plurality of paths through which the substrate S is transferred. For example, as shown in FIG. 1, the first transfer apparatus 10 may provide four transfer paths. However, the inventive concept is not limited thereto. The number of transfer paths of the substrate S provided by the first transfer apparatus 10 may be one or more.

The supporter 110 may be configured to support the first rotation shaft 120 and the second rotation shaft 140. In an example embodiment, two supporters 110 may be provided, and the two supporters 110 may be spaced apart from each other in a second direction Y perpendicular to a first direction X, which is a direction in which the substrate S is transferred. For example, the supporter 110 may have an opening (not shown), and the first rotation shaft 120 and the second rotation shaft 140 may be in the opening.

The first rotation shaft 120 may extend in the second direction Y between the supporters 110 and may rotate in a first rotation direction. The first rotation direction may be a rotation direction for transferring the substrate S in the first direction X. The first rotation shaft 120 may be rotated by the power of the first rotation driver 160.

The main transfer roller 130 may be a roller coupled to the first rotation shaft 120 and configured to transfer the substrate S in the first direction X. In an example embodiment, the main transfer roller 130 may include a guide portion 135 and a transfer portion 137.

In an example embodiment, the first transfer apparatus 10 may include a plurality of main transfer rollers 130. Each of the plurality of main transfer rollers 130 may include a pair of guide portions 135. The guide portions 135 may be spaced apart by a guide distance d in the second direction Y perpendicular to the first direction X and the transfer portion 137. The transfer portion 137 may extend between the pair of guide portions 135 and configured to contact the substrate S and transfer the substrate S in the first direction X.

The guide distance d may be defined as a distance formed by the guide portion 135 in the second direction Y. Additionally or alternatively, the guide distance d may be substantially the same as the distance of the transfer portion 137 of the main transfer roller 130 in the second direction Y. The guide distance d formed by the main transfer roller 130 may gradually decrease in the first direction X. As a result, the substrate S may be aligned without being separated while being transferred in the first direction X. The guide distance d of the main transfer roller 130 will be described in more detail later.

The guide portion 135 may be a portion of the main transfer roller 130 configured to surround a side portion of the substrate S and prevent the substrate S from being separated. The transfer portion 137 may be a portion of the main transfer roller 130 between the guide portions 135 and directly in contact with the substrate S. When the transfer portion 137 of the main transfer roller 130 is viewed in a planar view (X-Y plane), the transfer portion 137 may have an hourglass shape with a cross-sectional area tapered toward the center, but the present disclosure is not limited to the hourglass shape and may be a different shape.

The second rotation shaft 140 may be between the supporters 110 and may be configured to rotate in the first rotation direction. Additionally or alternatively, the second rotation shaft 140 may be configured to rotate in the same direction as the first rotation direction, wherein the first rotation direction is the rotation direction of the first rotation shaft 120, between the first rotation shafts 120. The second rotation shaft 140 may be rotated by the power of the second rotation driver 170.

The auxiliary transfer roller 150 may be a roller coupled to the second rotation shaft 140 and configured to transfer the substrate S in the first direction X. In an example embodiment, the auxiliary transfer roller 150 may have a cylindrical shape.

The first rotation driver 160 may include a driving apparatus configured to rotate the first rotation shaft 120 in the first rotation direction. For example, the first rotation driver 160 may include a combination of a motor and gears. Additionally or alternatively, the second rotation driver 170 may include a driving apparatus configured to rotate the second rotation shaft 140 in the first rotation direction. For example, the second rotation driver 170 may include a combination of a motor and gears.

In an example embodiment, the first rotation driver 160 and the second rotation driver 170 may include different motors. However, the inventive concept is not limited thereto, and the first rotation driver 160 and the second rotation driver 170 may be interconnected by a plurality of gears or belts and may include one or more motors.

The second transfer apparatus 20 may receive the substrate S from the first transfer apparatus 10 and transfer the substrate S. The second transfer apparatus 20 may transfer the substrate S in a direction different from the first direction X (e.g., any one of the second direction Y and a vertical direction Z). For example, as illustrated in FIG. 1, the second transfer apparatus 20 may transfer the substrate S received from the first transfer apparatus 10 in the second direction Y. However, the inventive concept is not limited thereto, and the second transfer apparatus 20 may transfer the substrate S in the first direction X and the vertical direction Z.

In an example embodiment, the second transfer apparatus 20 may include a guide rail 210, a substrate carrier 220, and a substrate carrier driver 230. For example, the second transfer apparatus 20 may include a transfer shuttle.

The guide rail 210 may include a rail providing a path through which the substrate carrier 220 may move. For example, The guide rail 210 may extend in the second direction Y when the second transfer apparatus 20 is configured to transfer the substrate S in the second direction Y.

The substrate carrier 220 may be an apparatus on which the substrate S transferred from the first transfer apparatus 10 is seated. The substrate carrier 220 may be slide-coupled to the guide rail 210 and may slide in a direction in which the guide rail 210 extends. For example, when the guide rail 210 extends in the second direction Y, the substrate carrier 220 may slide in the second direction Y.

In an example embodiment, the substrate carrier 220 may include a support plate 223 and a guide plate 227. The support plate 223 of the substrate carrier 220 may include a plate on which the substrate S transferred from the first transfer apparatus 10 is seated.

Additionally or alternatively, the guide plate 227 may include a plate configured to protrude upward from two opposite edges of the support plate 223 to support the side portion of the substrate S. The guide plate 227 may have a guide groove (not shown) extending in the first direction X to guide the substrate S.

The substrate carrier driver 230 may include power apparatuses configured to move the substrate carrier 220 on the guide rail 210. For example, the substrate carrier driver 230 may be a combination of a motor and a gear.

The sensor 300 may be configured to detect an abnormal transfer of the substrate S. Additionally or alternatively, the sensor 300 may be configured to detect whether the substrate S is normally transferred from the first transfer apparatus 10 to the second transfer apparatus 20. For example, the sensor 300 may detect the abnormal transfer of the substrate S when the substrate S collides with a part of the substrate carrier 220 of the second transfer apparatus 20 and is not transferred to the second transfer apparatus 20. For example, the sensor 300 may include a camera, a pressure sensor, or a proximity sensor that emits an output signal (e.g., an electromagnetic or ultrasonic signal) and detects reflected portions of the output signal.

Additionally or alternatively, the sensor 300 may be configured to generate a detection signal of the abnormal transfer and transmit the generated detection signal to the controller 400 when the abnormal transfer of the substrate S is detected.

The sensor 300 may generate different abnormal detection signals based on various kinds of abnormal transfer of the substrate S. In an example embodiment, the sensor 300 may generate different detection signals according to a catching position of the substrate S. When the substrate S is caught in the side portion of the substrate carrier 220 of the second transfer apparatus 20, the sensor 300 may generate a first abnormal catching signal and transmit the first abnormal catching signal to the controller 400. Additionally or alternatively, when the substrate S is caught in the lower portion of the substrate carrier 220 of the second transfer apparatus 20, the sensor 300 may generate a second abnormal catching signal different from the first abnormal catching signal and transmit the second abnormal catching signal to the controller 400.

In an example embodiment, the sensor 300 may generate different detection signals depending on the collision intensity of the substrate S and the substrate carrier 220. For example, when the substrate S collides with a part of the substrate carrier 220 at a first intensity in a state where the substrate S is not mounted on the substrate carrier 220, the sensor 300 may generate a first abnormal collision signal. Then, the sensor 300 may transmit the first abnormal collision signal to the controller 400. Additionally or alternatively, when the substrate S collides with a part of the substrate carrier 220 at a second intensity different from the first intensity in the state where the substrate S is not mounted on the substrate carrier 220, the sensor 300 may generate a second abnormal collision signal and transmit the second abnormal collision signal to the controller 400.

In an example embodiment, the sensor 300 may be between the first transfer apparatus 10 and the second transfer apparatus 20. However, the position of the sensor 300 is not limited to the above and may vary. For example, the sensor 300 may be in at least one of the first transfer apparatus 10 and the second transfer apparatus 20.

In an example embodiment, the sensor 300 may include an optical sensor. For example, the sensor 300 may include a transmitter configured to emit light and a receiver configured to receive the light emitted from the transmitter. The sensor 300 may detect the abnormal transfer of the substrate S based on whether light is detected, the intensity of the light, and the like. Additionally or alternatively, the sensor 300 may include a pressure sensor. Details of the pressure sensor will be described in more detail with reference to FIG. 3.

The swing apparatus 350 may be configured to swing the substrate carrier 220. Additionally or alternatively, when the sensor 300 detects the abnormal transfer of the substrate S, the swing apparatus 350 may apply a vibration to the substrate carrier 220. The vibration may be used to swing the substrate carrier 220. For example, the swing apparatus 350 may include a vibrator apparatus configured to apply vibration to the substrate carrier 220 in the horizontal direction and/or in the vertical direction.

In an example embodiment, the swing apparatus 350 may adjust the period of vibration applied to the substrate carrier 220, the amplitude of vibration, or the time for applying vibration, etc. For example, based on various abnormal detection signals generated by the sensor 300, the swing apparatus 350 may adjust the period of vibration applied to the substrate carrier 220, amplitude, time for applying vibration, etc.

In an example embodiment, the swing apparatus 350 may include at least one of a first swing apparatus 350a and a second swing apparatus 350b. For example, the swing apparatus 350 may include both the first swing apparatus 350a and the second swing apparatus 350b. The first swing apparatus 350a may include an apparatus configured to swing the substrate carrier 220 in the horizontal direction. The second swing apparatus 350b may include an apparatus configured to swing the substrate carrier 220 in the vertical direction.

In an example embodiment, when the substrate S is caught in the side portion of the substrate carrier 220, the first swing apparatus 350a may swing the substrate carrier 220 in the horizontal direction. As a result, the substrate S may be stably mounted on the support plate 223 of the substrate carrier 220. Additionally or alternatively, when the substrate S is caught in the lower portion of the substrate carrier 220, the second swing apparatus 350b may swing the substrate carrier 220 in the vertical direction. As a result, the substrate S may be stably mounted on the support plate 223 of the substrate carrier 220.

The controller 400 may be configured to generally control the transfer of the substrate S using the first transfer apparatus 10 and the second transfer apparatus 20. In an example embodiment, the controller 400 may be connected to the first rotation driver 160, the second rotation driver 170, the substrate carrier driver 230, the sensor 300, and the swing apparatus 350.

In an example embodiment, the controller 400 may control the swing apparatus 350 to swing the substrate carrier 220 based on the detection signal of the abnormal transfer of the substrate S transmitted by the sensor 300. For example, when the sensor 300 transmits different detection signals to the controller 400, corresponding to various kinds of the abnormal transfer of the substrate S, the controller 400 may control the swing apparatus 350 to move the substrate carrier 220 differently based on the detection signals.

In an example embodiment, the controller 400 may control the swing apparatus 350 to adjust at least one of the vibration direction and the vibration intensity of the substrate carrier 220 based on the above-described detection signals. Additionally or alternatively, the controller 400 may control the period of vibration applied by the swing apparatus 350 to the substrate carrier 220, the time for applying vibration, and the like.

In an example embodiment, when the controller 400 receives the detection signal of the abnormal transfer of the substrate S from the sensor 300, the controller 400 may gradually increase the intensity of vibration applied by the swing apparatus 350 to the substrate carrier 220.

In an example embodiment, the controller 400 may be implemented in hardware, firmware, software, or any combination thereof. For example, the controller 400 may include a computing apparatus, such as a workstation computer, a desktop computer, a laptop computer, a tablet computer, or the like. The controller 400 may include a simple controller, a complex processor such as a microprocessor, a CPU, a GPU, or the like, a processor configured by software, dedicated hardware, or firmware. The controller 400 may be implemented by, for example, a general-purpose computer or application-specific hardware such as a digital signal processor (DSP), a field-programmable gate array (FPGA), an application-specific integrated circuit (ASIC), or the like.

In an example embodiment, the operation of the controller 400 may be implemented as instructions stored on a machine-readable medium that may be read and executed by one or more processors. Here, the machine-readable medium may include any mechanism for storing and/or transmitting information that may be readable by a machine (e.g., a computing apparatus).

The first substrate transfer apparatus 1a, according to an example embodiment, may include the sensor 300 that detects the abnormal transfer of the substrate S (e.g., catching of the substrate S, etc.) and the swing apparatus 350 that swings the substrate carrier 220 when the abnormal transfer of the substrate S is detected. As a result, abnormal transfer of the substrate S is prevented, substrate transfer speed is increased, and the risk of damage to the substrate S is reduced.

Figure 2:
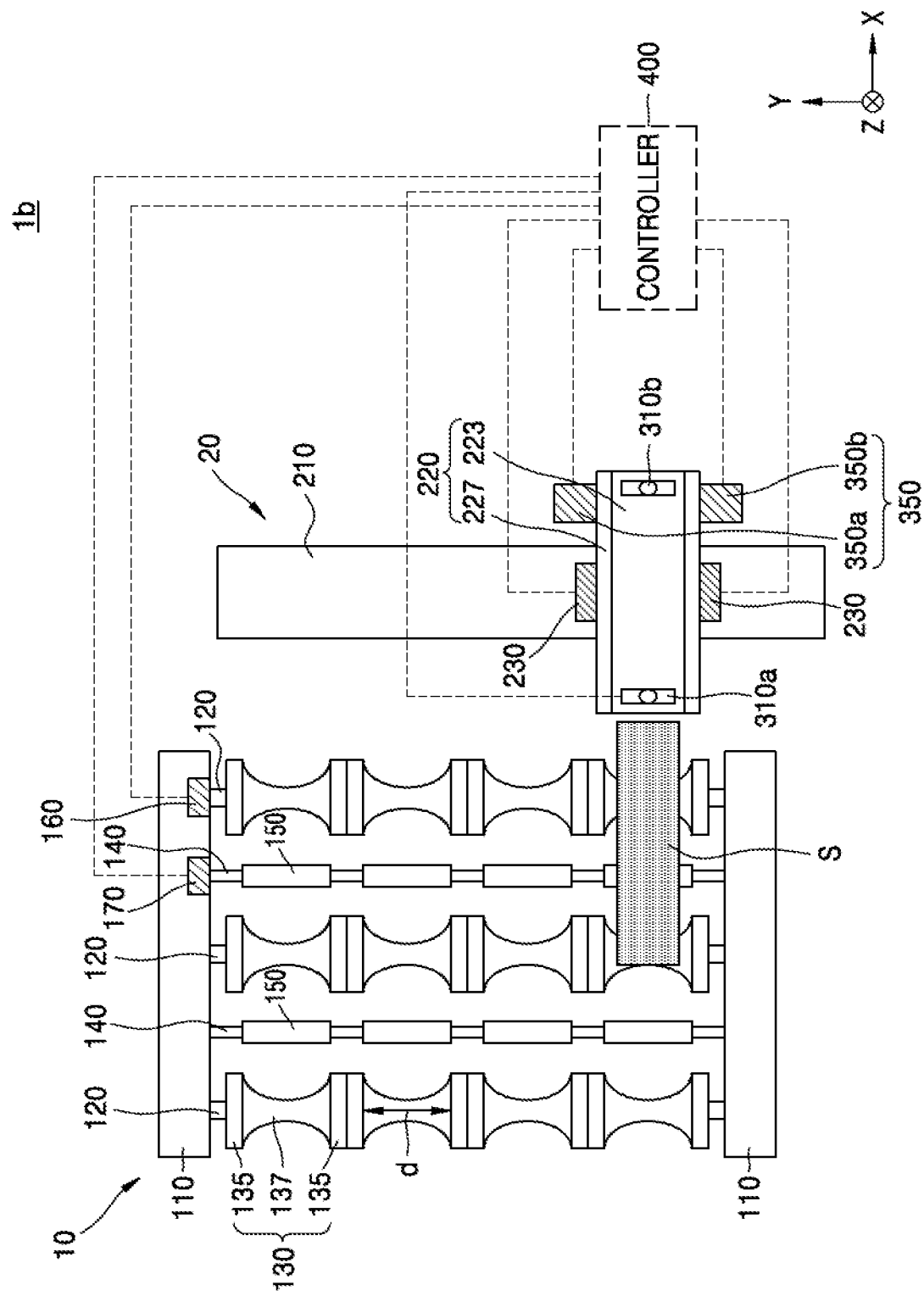
FIG. 2 is a plan view of a second substrate transfer apparatus according to an example embodiment.

FIG. 2 is a plan view of a second substrate transfer apparatus 1b according to an example embodiment. Hereinafter, redundant descriptions of the first substrate transfer apparatus 1a of FIG. 1 and the second substrate transfer apparatus 1b will be omitted, and differences therebetween will be mainly described.

Referring to FIG. 2, the second substrate transfer apparatus 1b may include a first sensor 310a and a second sensor 310b. The first sensor 310a may include a sensor configured to detect whether the substrate S is normally carried in into the substrate carrier 220, and the second sensor 310b may include a sensor configured to detect whether the substrate S is normally carried out from the substrate carrier 220.

In an example embodiment, the first sensor 310*a* and the second sensor 310*b* may be on the support plate 223 of the substrate carrier 220. For example, the first sensor 310*a* may be mounted on a part of the support plate 223 adjacent to a part that the substrate S is carried in, and the second sensor 310*b* may be mounted on a part of the support plate 223 adjacent to a part that the substrate S is carried out. However, the positions of the first sensor 310*a* and the second sensor 310*b* are not limited to the above.

In an example embodiment, the first sensor 310*a* and the second sensor 310*b* may detect whether the substrate S has passed through the upper portions of the first sensor 310*a* and the second sensor 310*b*. For example, the first sensor 310*a* and the second sensor 310*b* may include an optical sensor that emits light and detects whether the substrate S has passed through the upper portions of the first sensor 310*a* and the second sensor 310*b* by using the light.

Additionally or alternatively, the first sensor 310*a* and the second sensor 310*b* may include a pressure sensor that receives pressure applied by the substrate S and detects whether the substrate S has passed through the upper portions of the first sensor 310*a* and the second sensor 310*b* by using the pressure applied by the substrate S.

In an example embodiment, when the substrate S passes through the upper portion of the first sensor 310*a*, the first sensor 310*a* may generate a normal carry-in signal and transmit the normal carry-in signal to the controller 400. In this case, the controller 400 may not operate the swing apparatus 350. Additionally or alternatively, when the substrate S does not pass through the upper portion of the first sensor 310*a* and stays on the upper portion of the first sensor 310*a* for more than a predetermined time, the first sensor 310*a* may generate an abnormal carry-in signal and transmit the abnormal carry-in signal to the controller 400. In this case, the controller 400 may operate the swing apparatus 350 to swing the substrate carrier 220.

In an example embodiment, when the substrate S passes through the upper portion of the second sensor 310*b*, the second sensor 310*b* may generate a normal carry-out signal and transmit the normal carry-out signal to the controller 400. In this case, the controller 400 may not operate the swing apparatus 350. Additionally or alternatively, when the substrate S does not pass through the upper portion of the second sensor 310*b* and stays on the upper portion of the second sensor 310*b* for more than a predetermined time, the second sensor 310*b* may generate an abnormal carry-in signal and transmit the abnormal carry-in signal to the controller 400. In this case, the controller 400 may operate the swing apparatus 350 to swing the substrate carrier 220.

Figure 3:
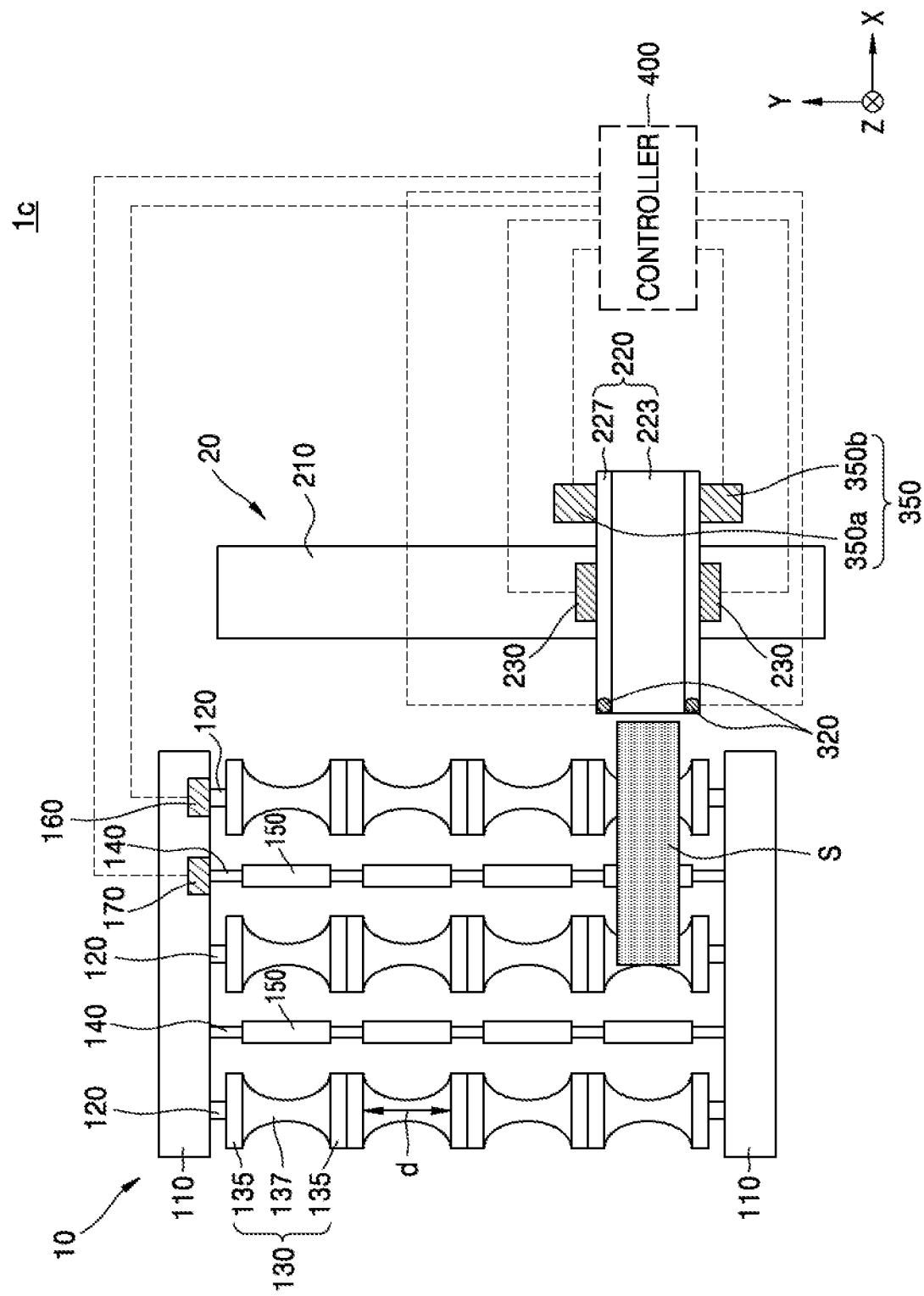
FIG. 3 is a plan view of a third substrate transfer apparatus according to an example embodiment.

FIG. 3 is a plan view of a third substrate transfer apparatus 1*c* according to an example embodiment. Hereinafter, redundant descriptions of the first substrate transfer apparatus 1*a* of FIG. 1 and the third substrate transfer apparatus 1*c* will be omitted, and differences therebetween will be mainly described.

Referring to FIG. 3, the third substrate transfer apparatus 1*c* may include a third sensor 320. In an example embodiment, the third sensor 320 may include a sensor configured to detect a collision between the substrate S and the substrate carrier 220.

In an example embodiment, the third sensor 320 may include a pressure sensor. The third sensor 320 may detect a collision position, collision intensity, and the like of the substrate S and the substrate carrier 220 and generate abnormal collision signals based on the collision position and the collision intensity. The controller 400 may control the swing apparatus 350 to swing the substrate carrier 220 differently based on different abnormal collision signals. However, the inventive concept is not limited thereto, and the third sensor 320 may detect the collision intensity, and a separate camera may detect the collision position.

In an example embodiment, when the third sensor 320 generates a first abnormal collision signal including a first collision position and a first collision intensity of the substrate S and the substrate carrier 220 and transmits the first abnormal collision signal to the controller 400, the controller 400 may control the swing apparatus 350 to swing the substrate carrier 220 at a first intensity and in a first direction. When the third sensor 320 generates a second abnormal collision signal including a second collision position and a second collision intensity respectively different from the first collision position and the first collision intensity of the substrate S and the substrate carrier 220 and transmits the second abnormal collision signal to the controller 400, the controller 400 may control the swing apparatus 350 to swing the substrate carrier 220 at a second intensity and in a second direction.

Figure 4:
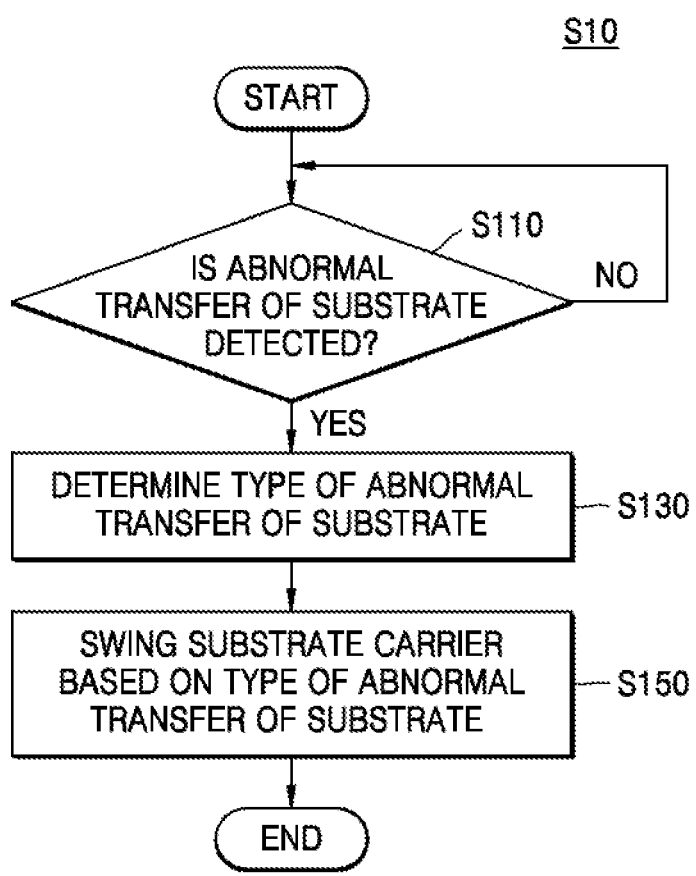
FIG. 4 is a flowchart illustrating operations of a first substrate transfer method according to an example embodiment.
Figure 5:
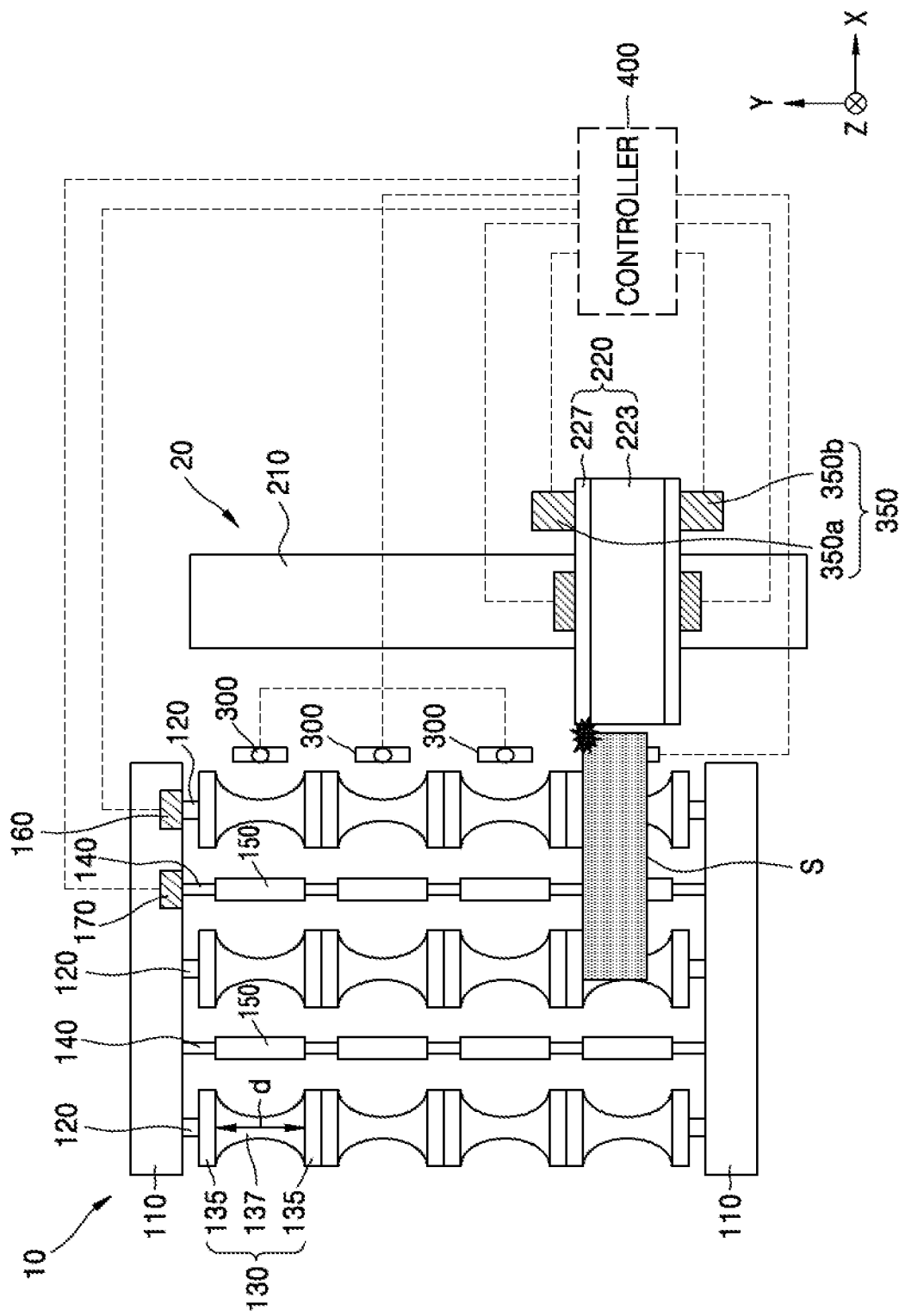
FIGS. 5 and 6 are diagrams illustrating respective operations of the first substrate transfer method according to an example embodiment.
Figure 6:
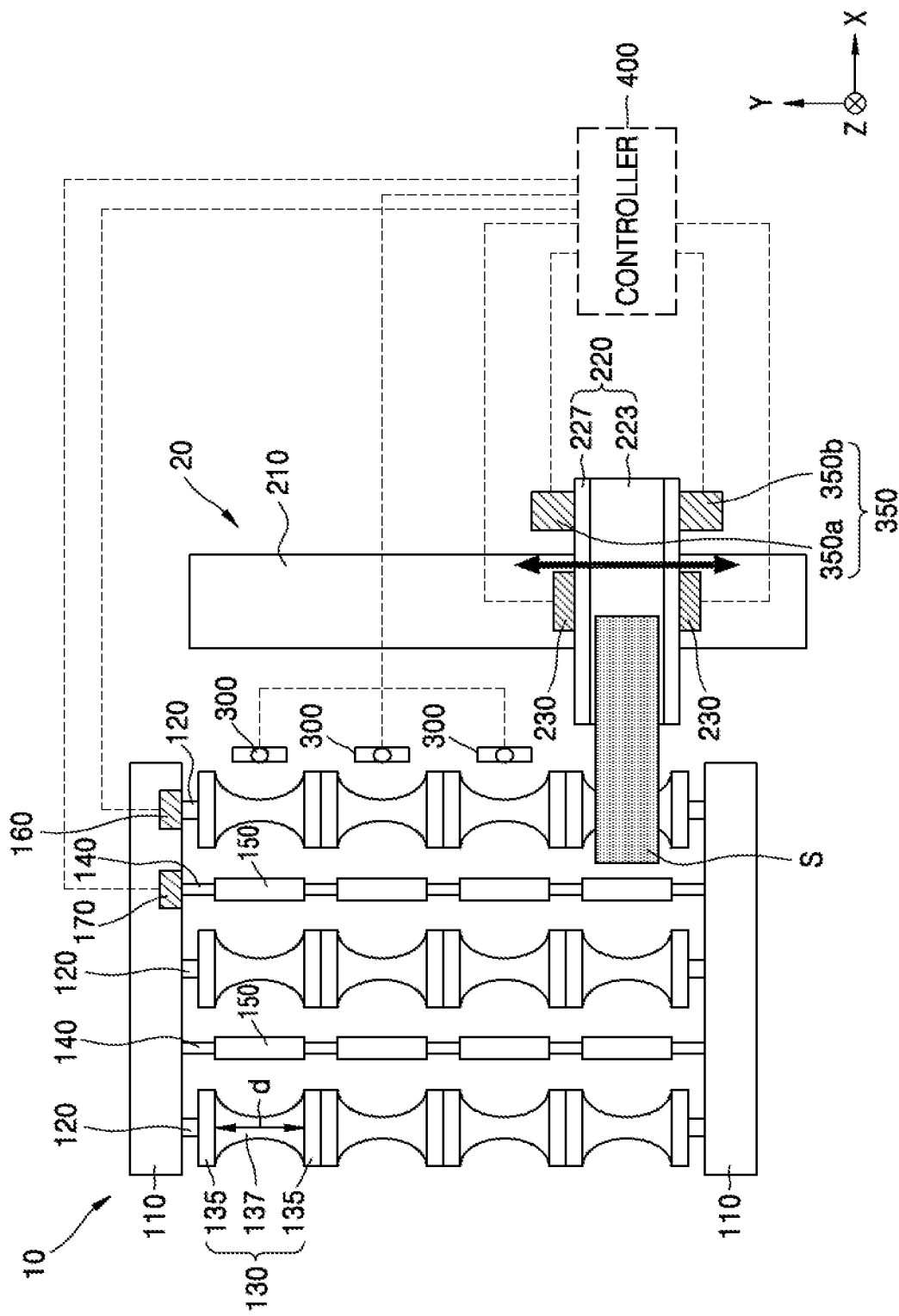
Figure 7:
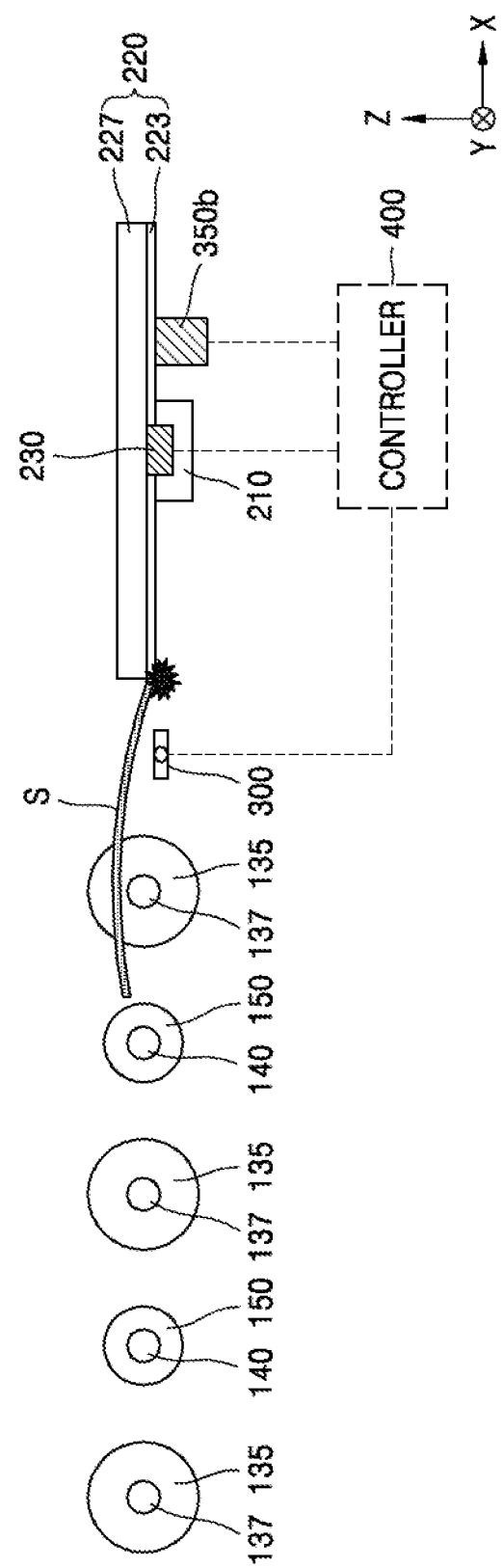
FIGS. 7 and 8 are diagrams illustrating respective operations of the first substrate transfer method according to an example embodiment.
Figure 8:
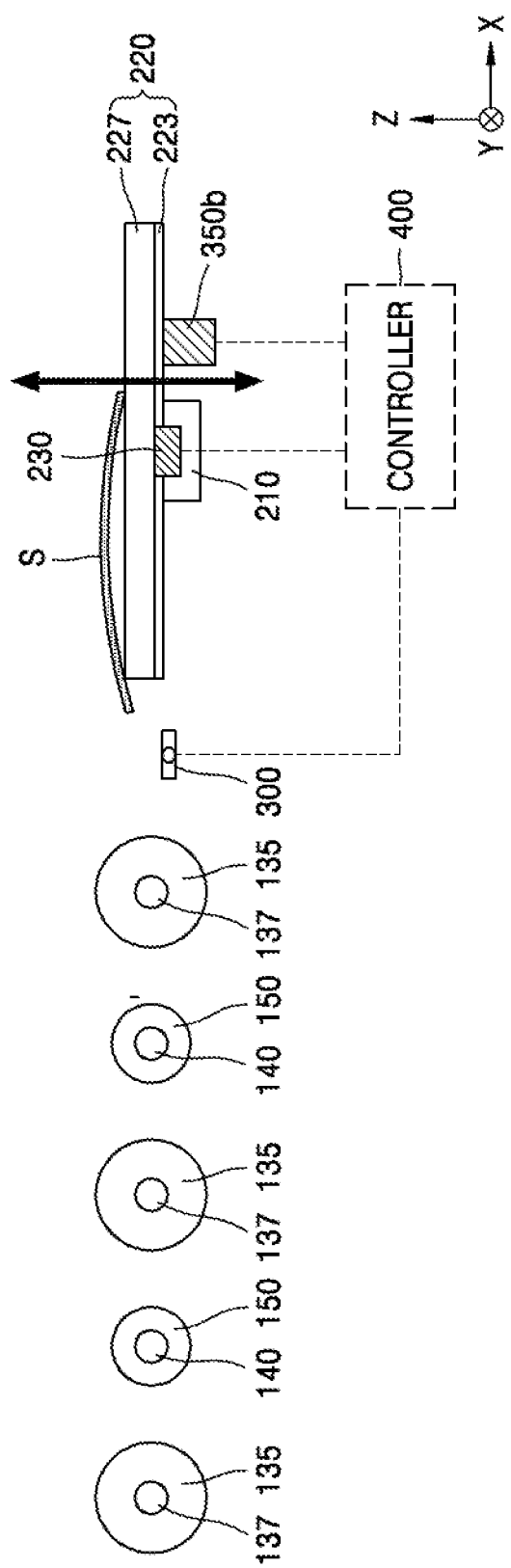

FIG. 4 is a flowchart illustrating operations of a first substrate transfer method S10 according to an example embodiment. FIGS. 5 and 6 are diagrams illustrating respective operations of the first substrate transfer method S10. FIGS. 7 and 8 are diagrams illustrating the respective operations of the first substrate transfer method S10.

Additionally or alternatively, the first substrate transfer method S10, according to an example embodiment, may include a method of transferring the substrate S in the first direction X using the substrate transfer apparatus 1*a* described with reference to FIG. 1.

Referring to FIG. 4, the first substrate transfer method S10 may include operation S110 of detecting an abnormal transfer of the substrate S, operation S120 of determining a type of the abnormal transfer of the substrate S, and operation S130 of swinging the substrate carrier 220 based on the type of the abnormal transfer of the substrate S.

Referring to FIGS. 4, 5, and 7 together, the first substrate transfer method S10 may include operation S110 of detecting an abnormal transfer of the substrate S. In operation S110, the sensor 300 may detect the abnormal transfer of the substrate S, generate a detection signal of the abnormal transfer of the substrate S and transmit the generated detection signal to the controller 400.

In operation S110, the sensor 300 may generate different detection signals according to the catching position of the substrate S and transmit the generated detection signals to the controller 400. In an exemplary embodiment, as shown in FIG. 4, when the substrate S is caught in the side portion of the substrate carrier 220, the sensor 300 may generate a first abnormal catching signal and transmit the first abnormal catching signal to the controller 400.

Additionally or alternatively, as shown in FIG. 7, when the substrate S is caught in the lower portion of the substrate carrier 220, the sensor 300 may generate a second abnormal catching signal different from the first abnormal catching signal and transmit the second abnormal catching signal to the controller 400.

Additionally or alternatively, in operation S110, the sensor 300 may generate different detection signals according to the collision intensity of the substrate S and the substrate carrier 220. The sensor 300 may transmit the detection signals to the controller 400. For example, when the substrate S collides with a part of the substrate carrier 220 at a first intensity in a state where the substrate S is not mounted on the substrate carrier 220, the sensor 300 may generate a first abnormal collision signal and transmit the first abnormal collision signal to the controller 400. Additionally or alternatively, when the substrate S collides with a part of the substrate carrier 220 at a second intensity different from the first intensity in the state where the substrate S is not mounted on the substrate carrier 220, the sensor 300 may generate a second abnormal collision signal and transmit the second abnormal collision signal to the controller 400.

The first substrate transfer method S10 may include operation S130 of swinging the substrate carrier 220 based on the type of the abnormal transfer of the substrate S. In operation S130, when the abnormal transfer of the substrate S is detected, the controller 400 may determine the type of the abnormal transfer of the substrate S.

In an example embodiment, when the controller 400 receives at least one of the above-described abnormal catching signals and abnormal collision signals from the sensor 300, the controller 400 may determine the catching position of the substrate S and the collision intensity of the substrate S and the substrate carrier 220. Additionally or alternatively, the controller 400 may calculate the intensity of vibration to be applied to the substrate carrier 220 and the direction of vibration based on the catching position of the substrate S and the collision intensity of the substrate S and the substrate carrier 220.

Referring to FIGS. 4, 6, and 8, the first substrate transfer method S10 may include operation S150, wherein operation S150 is the swinging the substrate carrier 220 based on the type of the abnormal transfer of the substrate S. In operation S150, the controller 400 may control the swing apparatus 350 to swing the substrate carrier 220 differently based on types of abnormal transfer of the substrate S received from the sensor 300.

As shown in FIG. 6, when the controller 400 receives the above-described first abnormal catching signal from the sensor 300, the controller 400 may control the swing apparatus 350 to swing the substrate carrier 220 in the horizontal direction. In other words, the controller 400 may operate the first swing apparatus 350a to swing the substrate carrier 220 in the horizontal direction.

Additionally or alternatively, as shown in FIG. 8, when the controller 400 receives the above-described second abnormal catching signal from the sensor 300, the controller 400 may control the swing apparatus 350 to swing the substrate carrier 220 in the vertical direction. In other words, the controller 400 may operate the second swing apparatus 350b to swing the substrate carrier 220 in the vertical direction.

In an example embodiment, the controller 400 may control the swing apparatus 350 to swing the substrate carrier 220 at different intensities based on abnormal collision signals received from the sensor 300. For example, the controller 400 may control the magnitude of the amplitude of vibration applied to the substrate carrier 220 based on the abnormal collision signals received from the sensor 300.

The first substrate transfer method S10 according to an example embodiment may determine the type of the abnormal transfer of the substrate S and control the swing apparatus 350 to swing the substrate carrier 220 based on the type of the abnormal transfer, thereby preventing the abnormal transfer of the substrate S, improving substrate transfer speed, and preventing physical damage of the substrate S.

Figure 9:
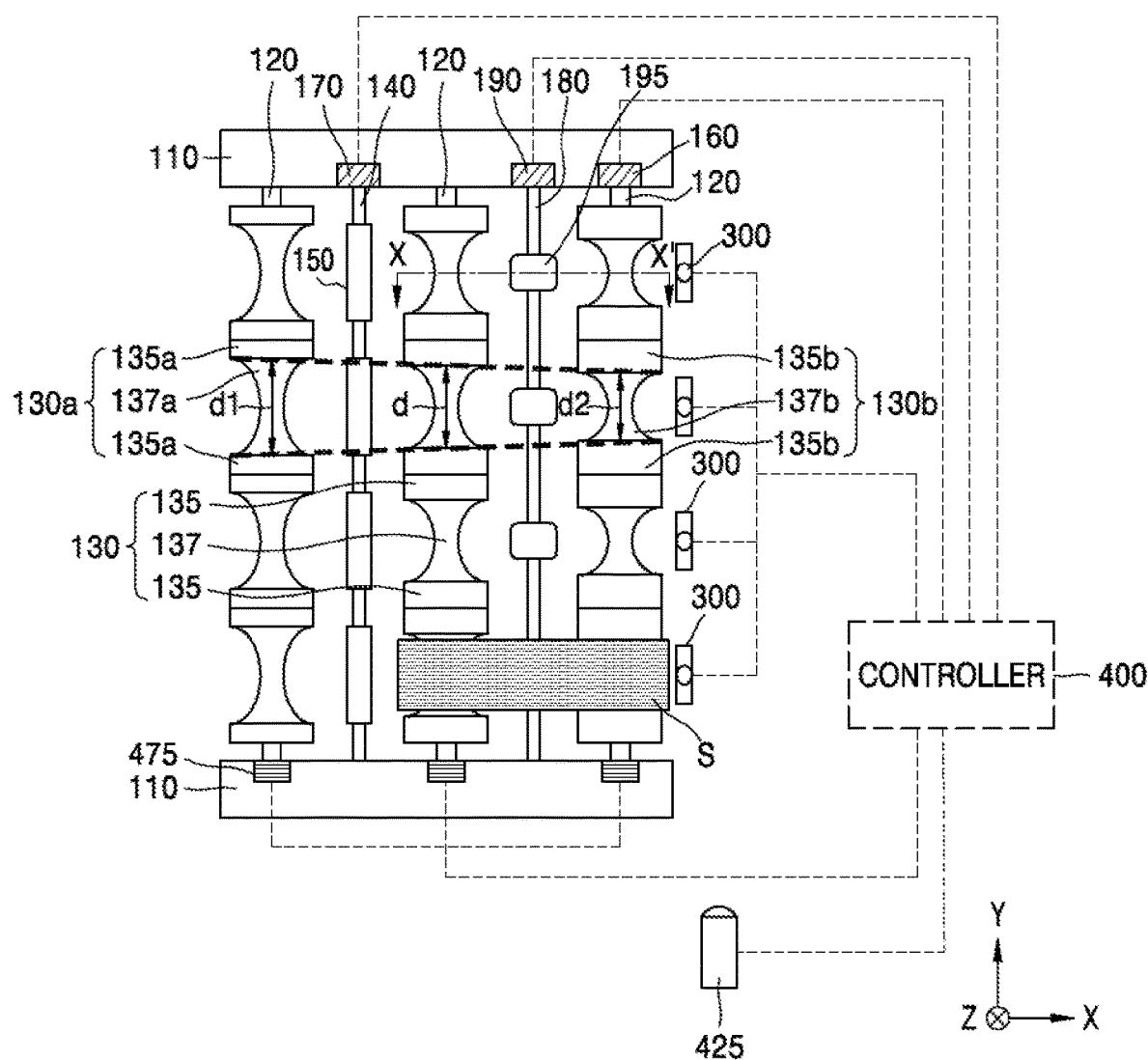
FIG. 9 is a plan view of a fourth substrate transfer apparatus according to an example embodiment.
Figure 10:
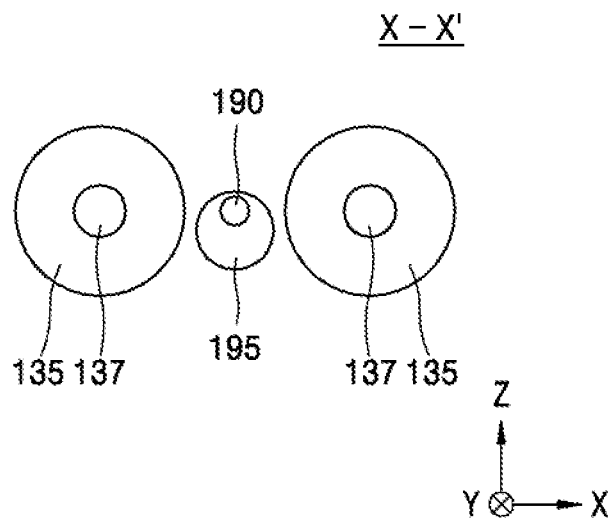
FIG. 10 is a cross-sectional view of the fourth substrate transfer apparatus taken along the line X-X' of FIG. 9.

FIG. 9 is a plan view of a fourth substrate transfer apparatus 2 according to an example embodiment. FIG. 10 is a cross-sectional view of the fourth substrate transfer apparatus 2 taken along the line X-X' of FIG. 9.

Referring to FIGS. 9 and 10, the fourth substrate transfer apparatus 2 may include the supporter 110, the first rotation shaft 120, the main transfer roller 130, the second rotation shaft 140, the auxiliary transfer roller 150, the first rotation driver 160, the second rotation driver 170, a camshaft 180, a third rotation driver 190, and an eccentric cam 195. Additionally or alternatively, the fourth substrate transfer apparatus 2 may further include the sensor 300, the controller 400, a camera 425, and a guide distance adjuster 475.

Descriptions of the supporter 110, the first rotation shaft 120, the main transfer roller 130, the second rotation shaft 140, the auxiliary transfer roller 150, the first rotation driver 160, and the second rotation driver 170 of the fourth substrate transfer apparatus 2 according to an example embodiment are redundant with those described with reference to FIG. 1. Therefore, detailed descriptions thereof will be omitted.

In an example embodiment, the camshaft 180 may be between the supporters 110 and configured to rotate. The camshaft 180 may be disposed between the first rotation shafts 120 and may be rotated by the power of the third rotation driver 190.

The third rotation driver 190 may include a driving apparatus configured to rotate the camshaft 180. The third rotation driver 190 may include a combination of a motor and gears. For example, the third rotation driver 190 may include a servo motor.

The eccentric cam 195 may be coupled to the camshaft 180 and configured to move the substrate S in the vertical direction Z. The eccentric cam 195 may include a mechanical apparatus for switching the rotational movement of the camshaft 180 into a reciprocating movement in the vertical direction Z of the substrate S.

Additionally or alternatively, the eccentric cam 195 may be configured to switch between a first cam position and a second cam position. When the substrate S is normally transferred in the first direction X, the eccentric cam 195 may be in the first cam position. When the eccentric cam 195 is in the first cam position, the substrate S may not be in contact with the eccentric cam 195 and may be in contact with the transfer roller 130. As a result, the substrate S may be transferred in the first direction X.

Additionally or alternatively, when the substrate S is not normally transferred in the first direction X (e.g., when the substrate S is caught in at least one of the main transfer roller 130 and the auxiliary transfer roller 150), the eccentric cam 195 may be in the second cam position different from the first cam position. When the eccentric cam 195 is in the second cam position, the substrate S may be in contact with the eccentric cam 195 and may be raised in the vertical direction Z by the eccentric cam 195.

Additionally or alternatively, the second cam position may be a position where the eccentric cam 195 rotates about 180 degrees from the first cam position. During a process of changing the eccentric cam 195 from the first cam position to the second cam position, the substrate S may be in contact with a part of the eccentric cam 195 and raised in the vertical direction Z. During a process of raising the substrate S in the vertical direction Z, the catching phenomenon of the substrate S may be eliminated.

Additionally or alternatively, during a process of changing the eccentric cam 195 from the second cam position to the first cam position, the substrate S may be in contact with the transfer roller 130 and spaced apart from the eccentric cam 195. As a result, the substrate S may be normally transferred in the first direction X.

In an example embodiment, the distance formed by the guide portion 135 of the main transfer roller 130 in the second direction Y may be defined as the guide distance d. Additionally or alternatively, the guide distance d may be substantially the same as the length of the transfer portion 137 of the main transfer roller 130 in the second direction Y. The guide distance d formed by the guide portion 135 of the main transfer roller 130 may gradually decrease in the first direction X. Hereinafter, the guide distance d formed by the main transfer roller 130 will be described in more detail.

In an example embodiment, the transfer roller 130 first in contact with the substrate S among the plurality of transfer rollers 130 may be defined as the first transfer roller 130*a*. Additionally or alternatively, the transfer roller 130 in final contact with the substrate S among the plurality of transfer rollers 130 may be defined as a second transfer roller 130*b*.

The first transfer roller 130*a* may include first guide portions 135*a* and a first transfer portion 137*a* between the first guide portions 135*a*, and the second transfer roller 130*b* may include second guide portions 135*b* and a second transfer portion 137*b* between the second guide portions 135*b*.

In an example embodiment, a first guide distance d1 formed by the first guide portion 135*a* of the first transfer roller 130*a* may be about 1.20 times to about 1.50 times the length of the substrate S in the second direction Y. For example, when the length of the substrate S in the second direction Y is about 77.5 millimeters (mm), the first guide distance d1 may be between about 93 mm and about 116 mm. Additionally or alternatively, when the length of the substrate S in the second direction Y is about 77.5 millimeters (mm), the first guide distance d1 may be about 98 mm.

Also, a second guide distance d2 formed by the second guide portion 135*b* of the second transfer roller 130*b* may be about 1.01 to about 1.10 times the length of the substrate S in the second direction Y. For example, when the length of the substrate S in the second direction Y is about 77.5 mm, the second guide distance d2 may be about 78.3 mm to about 85.3 mm. Additionally or alternatively, when the length of the substrate S in the second direction Y is about 77.5 millimeters (mm), the second guide distance d2 may be about 80.0 mm.

The guide distance d formed by the guide portion 135 of the main transfer roller 130 may decrease in the first direction X, such that the substrate S may be automatically aligned in the first direction X.

In an example embodiment, the guide distance adjuster 475 may be configured to adjust the guide distance d of the guide portion 135 of the main transfer roller 130. For example, the guide distance adjuster 475 may be connected to the plurality of guide portions 135 of the main transfer roller 130 and may adjust the guide distance d. For example, the guide distance adjuster 475 may include an actuator for driving the guide portion 135 in the second direction Y.

In an example embodiment, the sensor 300 may be configured to generate a detection signal of abnormal transfer of the substrate S and transmit the detection signal to the controller 400. For example, when the substrate S is caught in at least one of the main transfer roller 130 and the auxiliary transfer roller 150 and is not transferred in the first direction X, the sensor 300 may generate the detection signal of abnormal transfer of the substrate S and transmit the detection signal to the controller 400. The technical idea of the sensor 300 may be substantially the same as that described with reference to FIG. 1. Therefore, a detailed description thereof is omitted.

In an example embodiment, the camera 425 may be configured to observe the transfer of the substrate S in the first direction X. Further, the camera 425 may provide an image of the transfer of the substrate S in the first direction X to a display in real-time.

In an example embodiment, the controller 400 may be configured to generally control the transfer of the substrate S using the fourth substrate transfer apparatus 2. The controller 400 may be connected to the first rotation driver 160, the second rotation driver 170, the third rotation driver 190, the sensor 300, the camera 425, and the guide distance adjuster 475.

In an example embodiment, when the abnormal transfer of the substrate S is detected from the sensor 300 and the camera 425, the controller 400 may rotate the eccentric cam 195 by driving the third rotation driver 190 so as to raise the substrate S in the vertical direction. Additionally or alternatively, the controller 400 may control the guide distance adjuster 475 to adjust the guide distance d formed by the guide portion 135, based on the size of the substrate S and the degree of warpage of the substrate S.

The fourth substrate transfer apparatus 2, according to an example embodiment, may include the eccentric cam 195 configured to raise the substrate S in the vertical direction, thereby preventing a catching phenomenon of the substrate S, improving the substrate transfer speed, and preventing damage to the substrate S.

Figure 11:
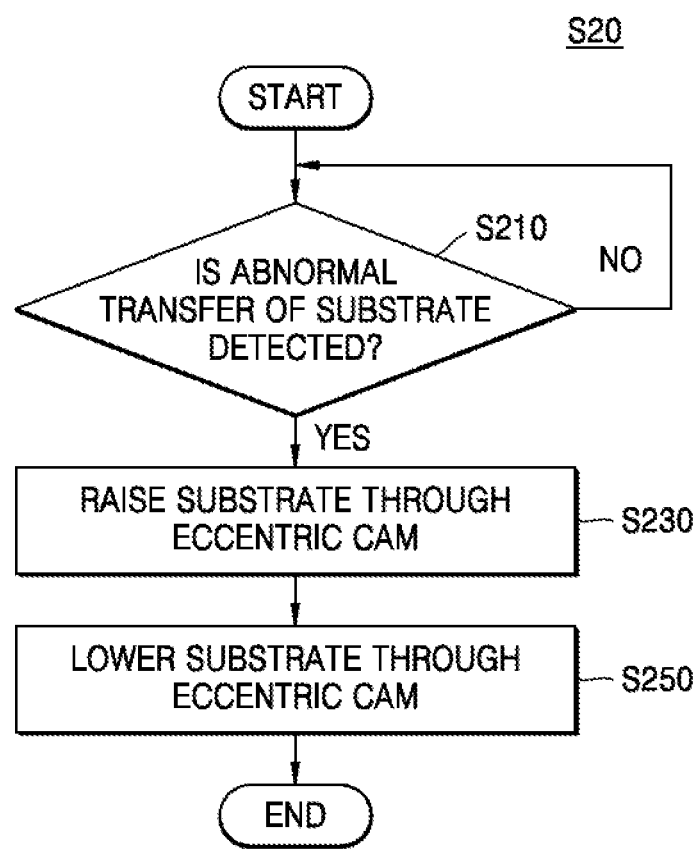
FIG. 11 is a flowchart illustrating operations of a second substrate transfer method according to an example embodiment.
Figure 12:
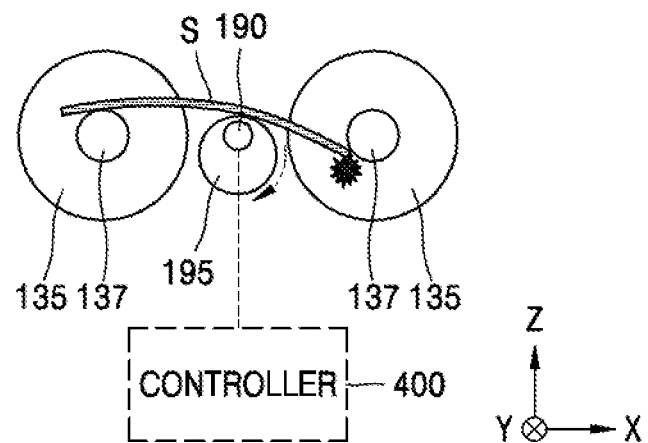
FIGS. 12 and 13 are diagrams illustrating respective operations of the second substrate transfer method.
Figure 13:
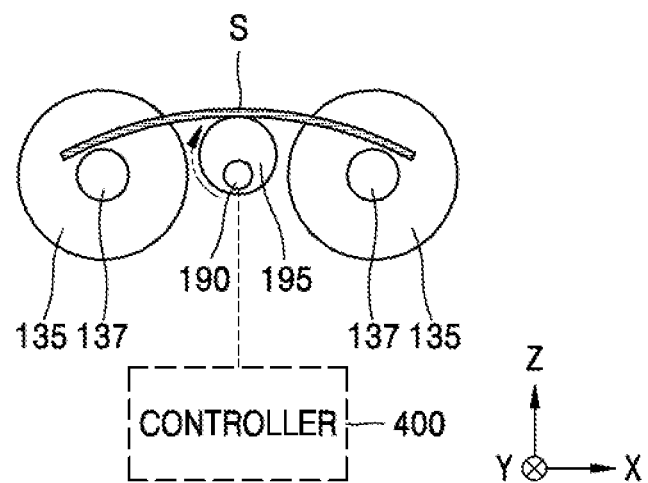

FIG. 11 is a flowchart illustrating operations of a second substrate transfer method S20 according to an example embodiment. FIGS. 12 and 13 are diagrams illustrating respective operations of the second substrate transfer method S20. Additionally or alternatively, the second substrate transfer method S20 may include a method of transferring the substrate S in the first direction X through the fourth substrate transfer apparatus 2 described above.

The second substrate transfer method S20 may include operation S210 of detecting an abnormal transfer of the substrate S, operation S230 of raising the substrate S through the eccentric cam 195, and operation S250 of lowering the substrate S through the eccentric cam 195.

Referring to FIGS. 11 and 12, in operation S210, the abnormal transfer of the substrate S may be detected through the sensor 300 and the camera 425. In an example embodiment, when the substrate S is caught in at least one of the main transfer roller 130 and the auxiliary transfer roller 150 and is not transferred in the first direction, the sensor 300 may detect a detection signal of the abnormal transfer of the substrate S and transmit the detection signal to the controller 400.

Additionally or alternatively, when the substrate S is caught in at least one of the main transfer roller 130 and the auxiliary transfer roller 150 and is not transferred in the first direction, a process operator may detect the abnormal transfer of the substrate S through the image transmitted by the camera 425 to the display.

Referring to FIGS. 11 and 13 together, in operation S230, the substrate S may be raised in the vertical direction Z through the eccentric cam 195. In an example embodiment, the controller 400 may drive the third rotation driver 190 to change the eccentric cam 195 from a first cam position to a second cam position so as to raise the substrate S in the vertical direction Z. During a process of changing the eccentric cam 195 from the first cam position to the second cam position, the substrate S may be in contact with a part of the eccentric cam 195 and may be raised in the vertical direction Z.

During a process of raising the substrate S in the vertical direction Z, a catching phenomenon of the substrate S may be eliminated.

Operation S230 may be performed according to instructions of the controller 400 receiving an abnormal transfer signal of the substrate S of the sensor 300. However, the inventive concept is not limited thereto, and operation S230 may be performed according to instructions of the process operator that detects an abnormal transfer state of the substrate S through the image provided by the camera 425.

In an example embodiment, in operation S250, the substrate S may be lowered in the vertical direction Z through the eccentric cam 195. In an example embodiment, the controller 400 may drive the third rotation driver 190 to change the eccentric cam 195 from the second cam position to the first cam position so as to lower the substrate S in the vertical direction Z. During a process of changing the eccentric cam 195 from the second cam position to the first cam position, the substrate S may be in contact with a part of the transfer roller 130 and transferred in the first direction X.

The second substrate transfer method S20, according to an example embodiment, may detect the abnormal transfer of the substrate S. When the abnormal transfer of the substrate S is detected, the second substrate transfer method S20 may raise the substrate S in the vertical direction using the eccentric cam 195, thereby preventing the catching phenomenon of the substrate S. As a result, the second substrate transfer method S20 may increase the substrate transfer speed and prevent damage to the substrate S.

Thus, according to embodiments of the inventive concept, a method of transferring a substrate may include moving a substrate from a first portion of a substrate transferring apparatus (e.g., a first transfer apparatus 10 or a first main transfer roller 130) toward a second portion of the substrate transferring apparatus (e.g., a second transfer apparatus 20 or a second main transfer roller 130); detecting an abnormal transfer from the first portion of the substrate transferring apparatus toward the second portion of the substrate transferring apparatus; generating an abnormal transfer signal based on detecting the abnormal transfer; adjusting the substrate transferring apparatus based on the abnormal transfer signal; and moving the substrate to the second portion of the substrate transferring apparatus based on adjusting the substrate transferring apparatus.

In some examples, the abnormal transfer comprises a collision between the substrate and the second portion of the substrate transferring apparatus. According to one embodiment, adjusting the substrate transferring apparatus comprises moving second portion of the substrate transferring apparatus to receive the substrate (e.g., moving or vibrating the second transfer apparatus 20). According to another embodiment, adjusting the substrate transferring apparatus comprises rotating an eccentric cam (e.g., eccentric cam 195) of the substrate transferring apparatus to change a vertical position of a portion of the substrate such that the second portion of the substrate transferring apparatus (e.g., a second main transfer roller 130) can receive the substrate (e.g., from a first main transfer roller 130).

Figure 14:
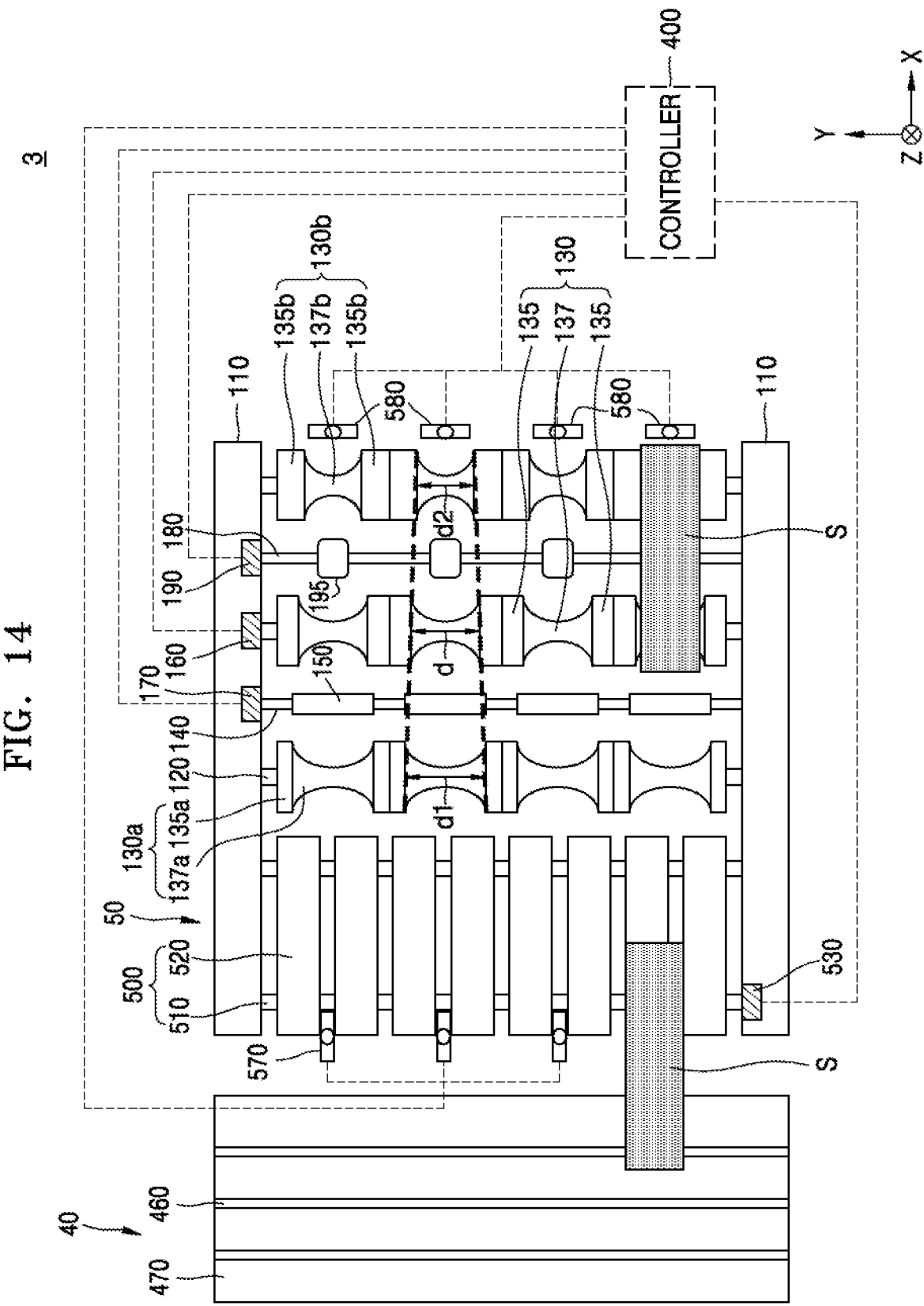
FIG. 14 is a plan view of a fifth substrate transfer apparatus according to an example embodiment.
Figure 15:
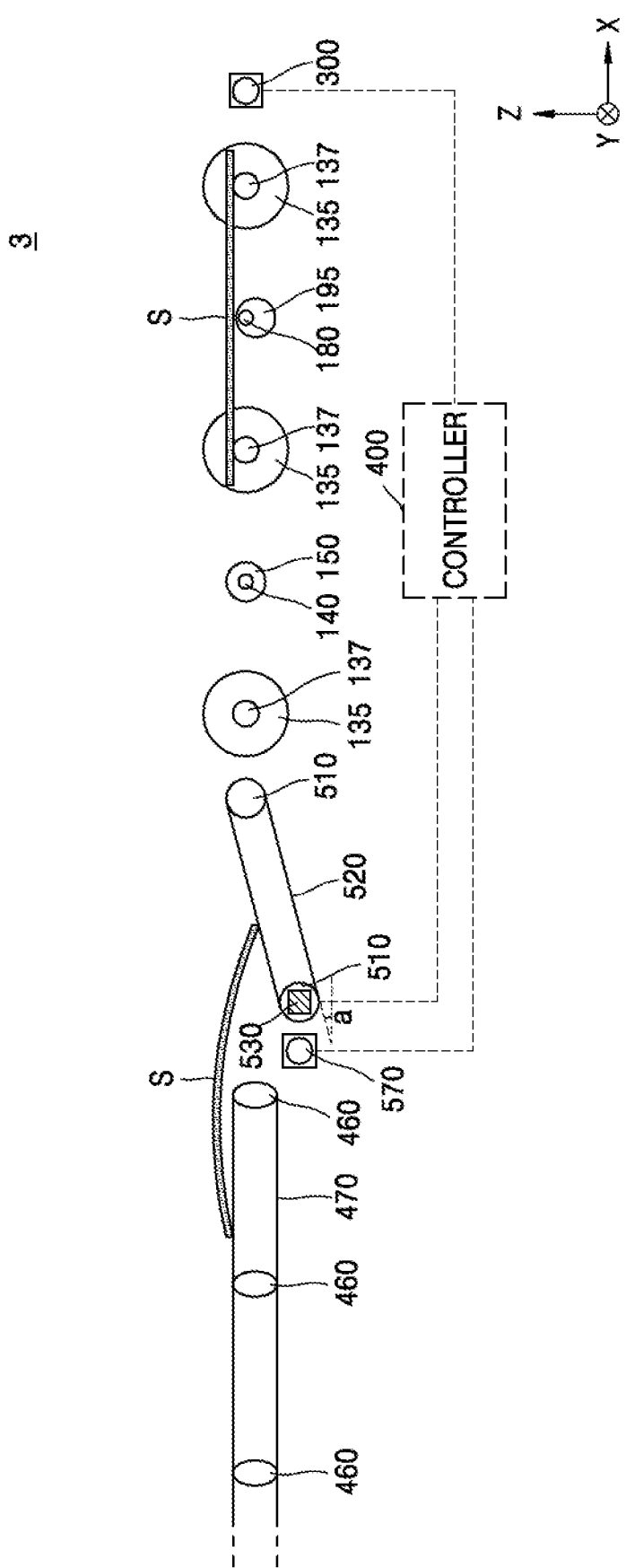
FIG. 15 is a cross-sectional view of the fifth substrate transfer apparatus according to an example embodiment.

FIG. 14 is a plan view of a fifth substrate transfer apparatus 3 according to an example embodiment, and FIG. 15 is a cross-sectional view of the fifth substrate transfer apparatus 3, according to an example embodiment. Referring to FIGS. 14 and 15 together, the fifth substrate transfer apparatus 3 may include an apparatus configured to transfer the substrate S in the first direction X. The fifth substrate transfer apparatus 3 may include a third transfer apparatus 40 and a fourth transfer apparatus 50.

In general, the third transfer apparatus 40 may include an apparatus configured to transfer the substrate S in the first direction X in a state in which the substrate S is not aligned, and the fourth transfer apparatus 50 may include an apparatus configured to transfer the substrate S in the first direction X in a state in which the substrate S is aligned. In general, due to the separation distance between the third transfer apparatus 40 and the fourth transfer apparatus 50, the warped substrate S may be caught between the third transfer apparatus 40 and the fourth transfer apparatus 50 and may not be transferred in the first direction X. Hereinafter, the fifth substrate transfer apparatus 3 according to an example embodiment capable of improving the above-described problems will be described in more detail.

In an example embodiment, the third transfer apparatus 40 may be configured to transfer the substrate S in the first direction X and transfer the substrate S to the fourth transfer apparatus 50. The third transfer apparatus 40 may include a plurality of third rotation shafts 460 and a transfer belt 470 surrounding the third rotation shafts 460. The substrate S may be transferred in the first direction X through rotation of the third rotation shaft 460.

In an example embodiment, the fourth transfer apparatus 50 may include an apparatus configured to receive the substrate S from the third transfer apparatus 40 and transfer the substrate S in the first direction X. The fourth transfer apparatus 50 may include the supporter 110, the first rotation shaft 120, the main transfer roller 130, the second rotation shaft 140, the auxiliary transfer roller 150, the first rotation driver 160, the second rotation driver 170, the camshaft 180, the third rotation driver 190, the eccentric cam 195, a conveyor belt 500, an inclination angle adjuster 530, a carry-in sensor 570, and a carry-out sensor 580, and the like. The technical idea of the supporter 110, the first rotation shaft 120, the main transfer roller 130, the second rotation shaft 140, the auxiliary transfer roller 150, the first rotation driver 160, the second rotation driver 170, the camshaft 180, the third rotation driver 190, and the eccentric cam 195 of the fourth transfer apparatus 50 is substantially the same as that described with reference to FIG. 9. Therefore, detailed descriptions thereof will be omitted.

In an example embodiment, the conveyor belt 500 may include a belt shaft 510 and a transfer belt 520. The belt shaft 510 may be configured to rotate, and the transfer belt 520 may support the substrate S and transfer the substrate S in the first direction X. The conveyor belt 500 may be installed adjacent to a carry-in part of the fourth transfer apparatus 50, but the inventive concept is not limited thereto. Additionally or alternatively, the conveyor belt 500 may be installed in front of the transfer roller 130 and transfer the substrate S received from the third transfer apparatus 40 to the transfer roller 130.

In an example embodiment, referring to FIG. 15, the conveyor belt 500 may be inclined upward toward the first direction X. In other words, the conveyor belt 500 may have an inclination angle a. For example, a part of the conveyor belt 500 adjacent to the third transfer apparatus 40 may be at a lower level than the third transfer apparatus 40, and a part of the conveyor belt 500 adjacent to the transfer roller 130 of the fourth transfer apparatus 50 may be at a higher level than the third transfer apparatus 40. As a result, when the substrate S is transferred from the third transfer apparatus 40 to the fourth transfer apparatus 50 in a state in which the substrate S is warped in a convex upward shape, a part of the substrate S may be in contact with the conveyor belt 500. As a result, the substrate S may be transferred in the first direction X without being caught between the third transfer apparatus 40 and the fourth transfer apparatus 50.

In an example embodiment, the inclination angle adjuster 530 may be configured to adjust the inclination angle a formed by the conveyor belt 500. Additionally or alternatively, the inclination angle adjuster 530 may adjust the inclination angle a formed by the conveyor belt 500 based on the size of the substrate S to be transferred, a degree of warpage of the substrate S, and an abnormal transfer state of the substrate S. For example, the inclination angle adjuster 530 may include an actuator configured to adjust the position of at least one of the plurality of belt shafts 510 in the vertical direction Z.

In an example embodiment, the carry-in sensor 570 may include a sensor that detects whether the substrate S is normally carried in into the fourth transfer apparatus 50, and the carry-out sensor 580 may include a sensor that detects whether the substrate S is normally carried out from the fourth transfer apparatus 5.

In an example embodiment, when the substrate S is not normally carried in into the fourth transfer apparatus 50, the carry-in sensor 570 may transmit an abnormal carry-in signal to the controller 400. Additionally or alternatively, when the substrate S is not normally carried out from the fourth transfer apparatus 50, the carry-out sensor 580 may transmit an abnormal carry-out signal to the controller 400.

The controller 400 may be connected to the carry-in sensor 570, the carry-out sensor 580, the third rotation driver 190, and the inclination angle adjuster 530. The controller 400 may control at least one of the third rotation driver 190 and the inclination angle adjuster 530 based on signals transmitted from the carry-in sensor 570 and the carry-out sensor 580.

In an example embodiment, when the controller 400 receives the abnormal carry-in signal from the carry-in sensor 570, the controller 400 may control the inclination angle adjuster 530 to adjust the inclination angle a. However, the inventive concept is not limited thereto, and the controller 400 may adjust the inclination angle a through a separate sensor that senses the size of the substrate S and the degree of warpage of the substrate S.

Additionally or alternatively, as described above, when the controller 400 receives the abnormal carry-out signal from the carry-out sensor 580, the controller 400 may drive the third rotation driver 190 to rotate the eccentric cam 195.

Figure 16:
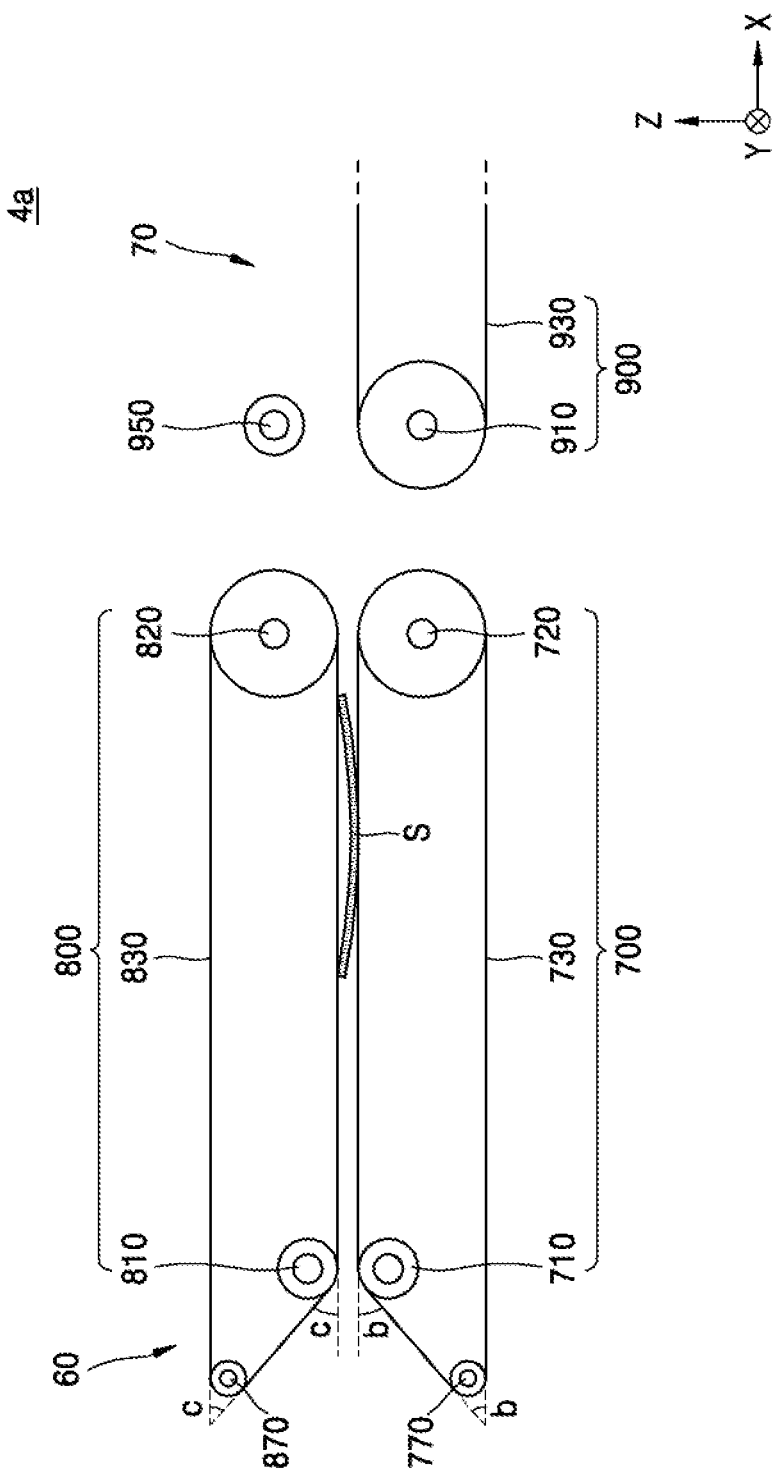
FIG. 16 is a cross-sectional view of a sixth substrate transfer apparatus according to an example embodiment.

FIG. 16 is a cross-sectional view of a sixth substrate transfer apparatus 4a, according to an example embodiment. The sixth substrate transfer apparatus 4a may include a fifth transfer apparatus 60 and a sixth transfer apparatus 70. The fifth transfer apparatus 60 may be configured to transfer the substrate S in the first direction X and to transfer the substrate S to the sixth transfer apparatus 70, and the sixth transfer apparatus 70 may be configured to receive the substrate S from the fifth transfer apparatus 60 and transfer the substrate S in the first direction X.

In an example embodiment, the fifth transfer apparatus 60 may include a first lower conveyor belt 700 and a first upper conveyor belt 800. The first lower conveyor belt 700 and the first upper conveyor belt 800 may cooperate to transfer the substrate S in the first direction X. The first lower conveyor belt 700 may include a first lower rotation shaft 710, a second lower rotation shaft 720, a first lower transfer belt 730, and a lower inclination angle forming shaft 770.

In an example embodiment, the first lower rotation shaft 710 may rotate in a first rotation direction. The first rotation direction may be a rotation direction for transferring the substrate S in the first direction X, and referring to FIG. 16, the first rotation direction may be clockwise.

The second lower rotation shaft 720 may be spaced apart from the first lower rotation shaft 710 in the first direction X and may rotate in the same direction as the first rotation direction. The first lower transfer belt 730 may connect the first lower rotation shaft 710, the second lower rotation shaft 720, and the lower inclination angle forming shaft 770 and may be in contact with a part of the lower surface of the substrate S.

The lower inclination angle forming shaft 770 may form a lower inclination angle b in a part of the first lower conveyor belt 700 into which the substrate S is carried in. In other words, the first lower conveyor belt 700 may be inclined upward toward the first direction X in the carry-in part of the substrate S. For example, the lower inclination angle b may be from about 30 degrees to about 60 degrees. As a result, when the substrate S is transferred to the first lower conveyor belt 700 in a convex upward warped state, a part of the substrate S may contact the first lower conveyor belt 700 and may be transferred normally in the first direction X.

In an example embodiment, the lower inclination angle forming shaft 770 may be in front of the first lower rotation shaft 710 to form the lower inclination angle b and may be at a lower level than the first lower rotation shaft 710.

The first upper conveyor belt 800 may include a first upper rotation shaft 810, a second upper rotation shaft 820, a first upper transfer belt 830, and an upper inclination angle forming shaft 870. In an example embodiment, the first upper rotation shaft 810 may rotate in a second rotation direction which is a direction opposite to the first rotation direction. The second rotation direction may be a rotation direction for transferring the substrate S in the first direction X, and referring to FIG. 16, the second rotation direction may be counterclockwise.

The second upper rotation shaft 820 may be spaced apart from the first upper rotation shaft 810 in the first direction X and may rotate in the same direction as the second rotation direction. The first upper transfer belt 830 may connect the first upper rotation shaft 810, the second upper rotation shaft 820, and the upper inclination angle forming shaft 870 and may be in contact with a part of the upper surface of the substrate S.

The upper inclination angle forming shaft 870 may form an upper inclination angle c in a part of the first upper conveyor belt 800 into which the substrate S is carried in. In other words, the first upper conveyor belt 800 may be inclined downward toward the first direction X in the carry-in part of the substrate S. For example, the upper inclination angle c may be from about 30 degrees to about 60 degrees. As a result, when the substrate S is transferred to the first upper conveyor belt 800 in a convex downward warped state, a part of the substrate S may contact the first upper conveyor belt 800 and may be transferred normally in the first direction X.

In an example embodiment, the upper inclination angle forming shaft 870 may be in front of the first upper rotation shaft 810 to form the upper inclination angle c and may be at a level lower than the first upper rotation shaft 810.

In an example embodiment, as shown in FIG. 16, a gap (i.e., a separation distance in the vertical direction Z) in the vertical direction Z between the first lower transfer belt 730 and the first upper transfer belt 830 may be formed uniformly. For example, the gap in the vertical direction Z formed by the first lower transfer belt 730 and the first upper transfer belt 830 in the part where the substrate S is carried in may be substantially the same as the gap in the vertical direction Z formed by the first lower transfer belt 730 and the first upper transfer belt 830 in the part where the substrate S is carried out. The gap in the vertical direction Z formed by the first lower transfer belt 730 and the first upper transfer belt 830 may be adjusted based on the size of the substrate S, a degree of warpage of the substrate S, and the like.

In an example embodiment, as shown in FIG. 16, the gap between the first lower transfer belt 730 and the first upper transfer belt 830 in the part where the substrate S is carried may be greater than the gap between the first lower transfer belt 730 and the first upper transfer belt 830 in the part where the substrate S is carried out.

While the substrate S is transferred in the first direction X through the fifth transfer apparatus 60, the first lower conveyor belt 700 may apply upward pressure to the substrate S, and the first upper conveyor belt 800 may apply downward pressure to the substrate S. As a result, the warpage of the substrate S may be temporarily increased while the warped substrate S is transferred in the first direction X by the fifth transfer apparatus 60.

The sixth transfer apparatus 70 may include a second lower conveyor belt 900 and a guide roller 950. The second lower conveyor belt 900 may include a second lower rotating shaft 910 and a second lower transfer belt 930.

The guide roller 950 may include a roller configured to guide the transfer of the substrate S from the fifth transfer apparatus 60 to the sixth transfer apparatus 70. The guide roller 950 may be spaced apart from the second lower conveyor belt 900 in the vertical direction. Additionally or alternatively, the guide roller 950 may be installed in the carry-in part of the sixth transfer apparatus 70.

In an example embodiment, when the substrate S is transferred from the fifth transfer apparatus 60 to the sixth transfer apparatus 70 in a convex downward state, the substrate S may contact the guide roller 950. The guide roller 950 may guide the substrate S in the first direction X through a rotation.

Figure 17:
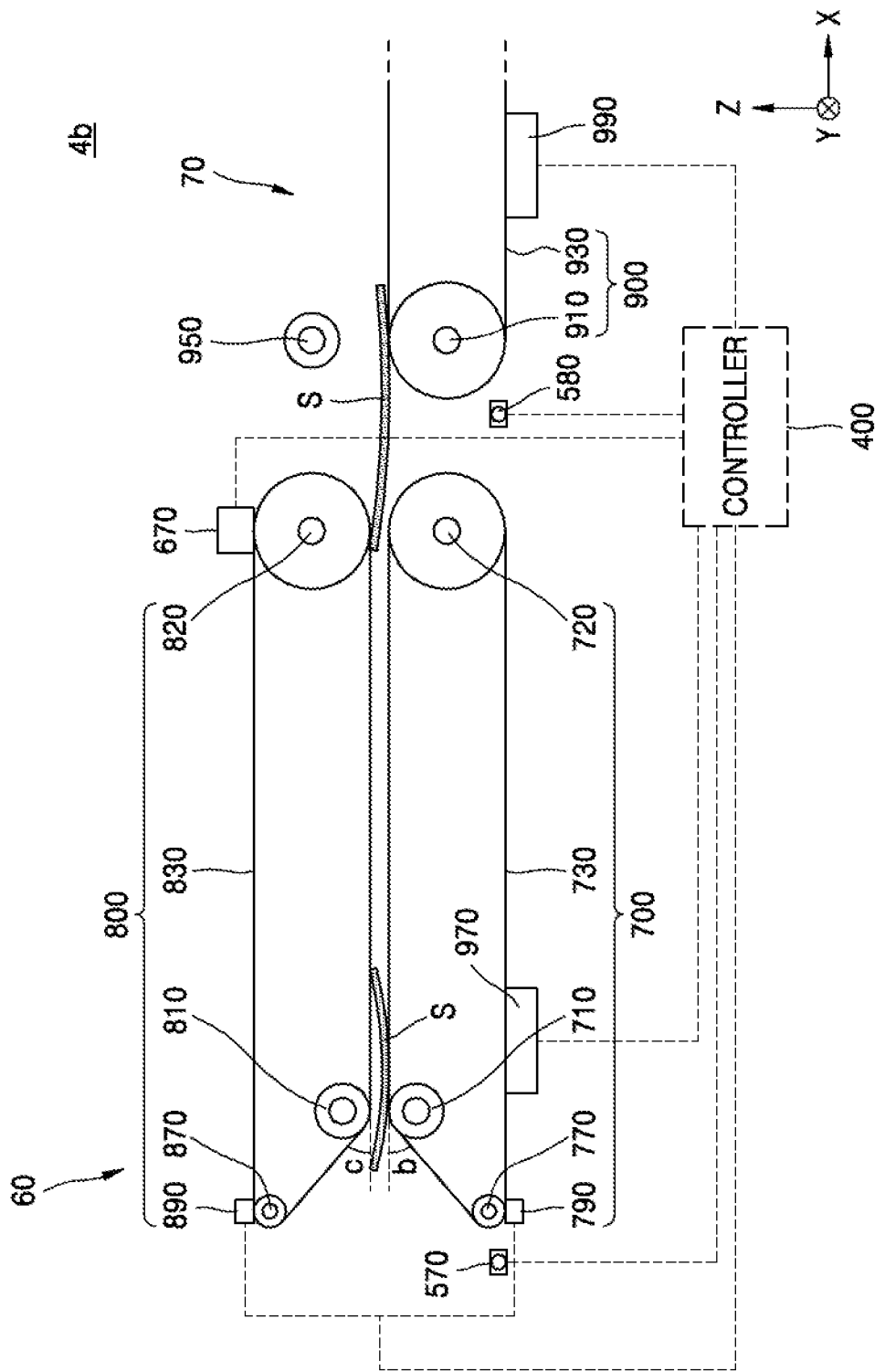
FIG. 17 is a cross-sectional view of a seventh substrate transfer apparatus according to an example embodiment.

FIG. 17 is a cross-sectional view of a seventh substrate transfer apparatus 4b, according to an example embodiment. Hereinafter, redundant descriptions of the sixth substrate transfer apparatus 4a of FIG. 16 and the seventh substrate transfer apparatus 4b of FIG. 17 are omitted, and differences therebetween will be mainly described.

Referring to FIG. 17, the seventh substrate transfer apparatus 4b may further include the controller 400, the carry-in sensor 570, the carry-out sensor 580, a conveyor belt gap adjuster 670, a lower inclination angle adjuster 790, an upper inclination angle adjuster 890, a first swing apparatus 970, and a second swing apparatus 990. The technical idea of the controller 400, the carry-in sensor 570, and the carry-out sensor 580 is substantially the same as that described above. Therefore, detailed descriptions thereof are omitted.

In an example embodiment, the conveyor belt gap adjuster 670 may be configured to adjust a separation distance d3 in the vertical direction Z between the first lower conveyor belt 700 and the first upper conveyor belt 800. Additionally or alternatively, the conveyor belt gap adjuster 670 may be configured to adjust the separation distance d3 in the vertical direction Z between the first lower conveyor belt 700 and the first upper conveyor belt 800 based on the size of the substrate S and a degree of warpage of the substrate S, and the like.

In an example embodiment, the lower inclination angle adjuster 790 may be configured to adjust the magnitude of the lower inclination angle b formed by the first lower conveyor belt 700. Additionally or alternatively, the lower inclination angle adjuster 790 may adjust the magnitude of the lower inclination angle b based on the size of the substrate S and the degree of warpage of the substrate S. For example, the lower inclination angle adjuster 790 may adjust the magnitude of the lower inclination angle b by adjusting the position of the lower inclination angle forming shaft 770 in the vertical inclination Z.

In an example embodiment, the upper inclination angle adjuster 890 may be configured to adjust the magnitude of the upper inclination angle c formed by the first upper conveyor belt 800. Additionally or alternatively, the upper inclination angle adjuster 890 may adjust the magnitude of the upper inclination angle c based on the size of the substrate S and the degree of warpage of the substrate S. For example, the upper inclination angle adjuster 890 may adjust the magnitude of the upper inclination angle c by adjusting the position of the upper inclination angle forming shaft 870 in the vertical direction Z.

In an example embodiment, the first swing apparatus 970 may be configured to swing the fifth transfer apparatus 60. For example, the first swing apparatus 970 may be coupled to at least one of the first lower conveyor belt 700 and the first upper conveyor belt 800. When the substrate S is caught in the fifth transfer apparatus 60 and is not normally transferred in the first direction X, the first swing apparatus 970 may swing the fifth transfer apparatus 60. The technical idea of the first swing apparatus 970 is substantially the same as that of the swing apparatus 350 described with reference to FIG. 1. Therefore, a detailed description thereof will be omitted.

In an example embodiment, the second swing apparatus 990 may be configured to swing the sixth transfer apparatus 70. For example, the second swing apparatus 990 may be coupled to the second lower conveyor belt 900. When the substrate S is caught in the sixth transfer apparatus 70 and is not normally transferred in the first direction X, the second swing apparatus 990 may swing the sixth transfer apparatus 70. The technical idea of the second swing apparatus 990 is substantially the same as that of the swing apparatus 350 described with reference to FIG. 1. Therefore, a detailed description thereof will be omitted.

Figure 18:
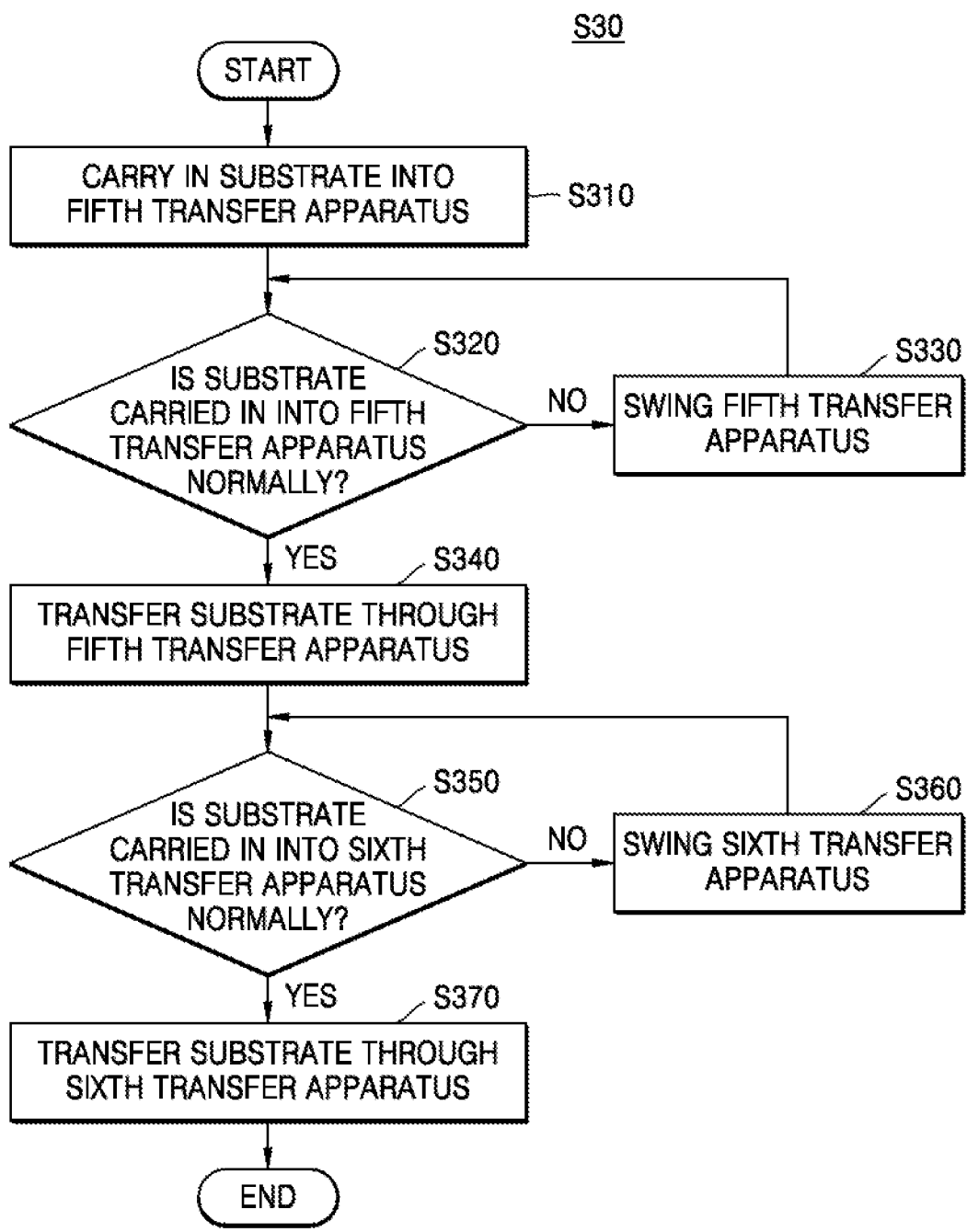
FIG. 18 is a flowchart showing operations of a third substrate transfer method according to an example embodiment.

FIG. 18 is a flowchart showing operations of a third substrate transfer method S30, according to an example embodiment. FIGS. 19 to 23 are diagrams showing respective operations of the third substrate transfer method S30. The third substrate transfer method S30 may include a method of transferring the substrate S in the first direction X through the seventh substrate transfer apparatus 4b of FIG. 16.

Referring to FIG. 18, the third substrate transfer method S30 may include operation S310, S320, S330, S340, S350, S360, and S370. Operation S310 may carry in the substrate S into the fifth transfer apparatus 60. Operation S320 may determine whether the substrate S is normally carried in into the fifth transfer apparatus 60. Operation S330 may swing the fifth transfer apparatus 60. Operation S340 may transfer the substrate S through the fifth transfer apparatus 60. Operation S350 may determine whether the substrate S is normally carried in into the sixth transfer apparatus 70. Operation S360 may swing the sixth transfer apparatus 70. Operation S370 may transfer the substrate S through the sixth transfer apparatus 70.

Figure 19:
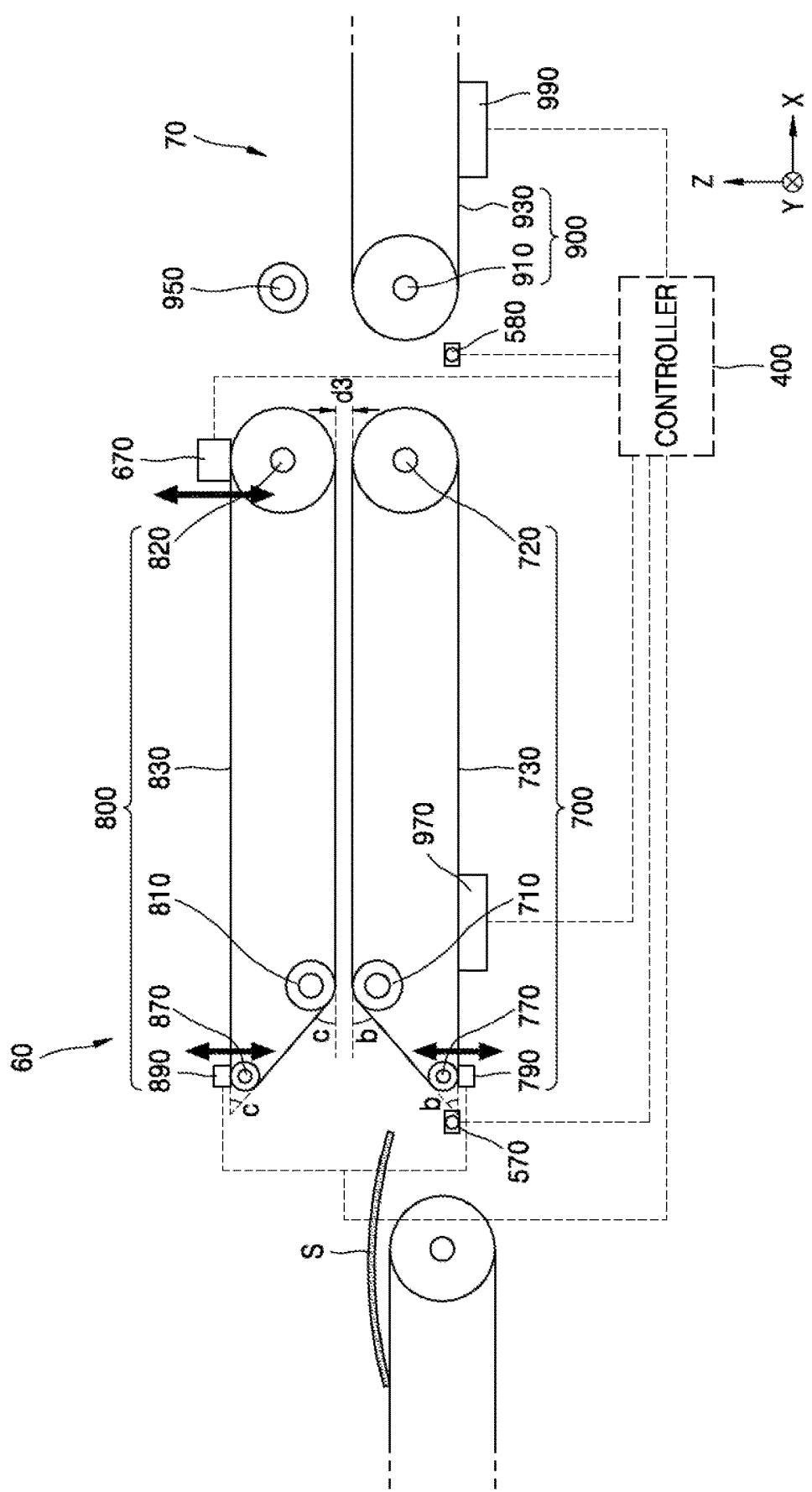
FIGS. 19 to 23 are diagrams showing respective operations of the third substrate transfer method.

Referring to FIGS. 18 and 19 together, operation S310 may be an operation of carrying in the substrate S into the fifth transfer apparatus 60. Additionally or alternatively, in operation S310, the controller 400 may control the conveyor belt gap adjuster 670 to adjust the separation distance d3 between the first lower conveyor belt 700 and the first upper conveyor belt 800 in the vertical direction Z based on the size of the substrate S and a degree of warpage of the substrate S.

Additionally or alternatively, in operation S310, the controller 400 may control the lower inclination angle adjuster 790 and the upper inclination angle adjuster 890 to adjust the lower inclination angle b and the upper inclination angle c respectively based on the size of the substrate S and the degree of warpage of the substrate S.

Figure 20:
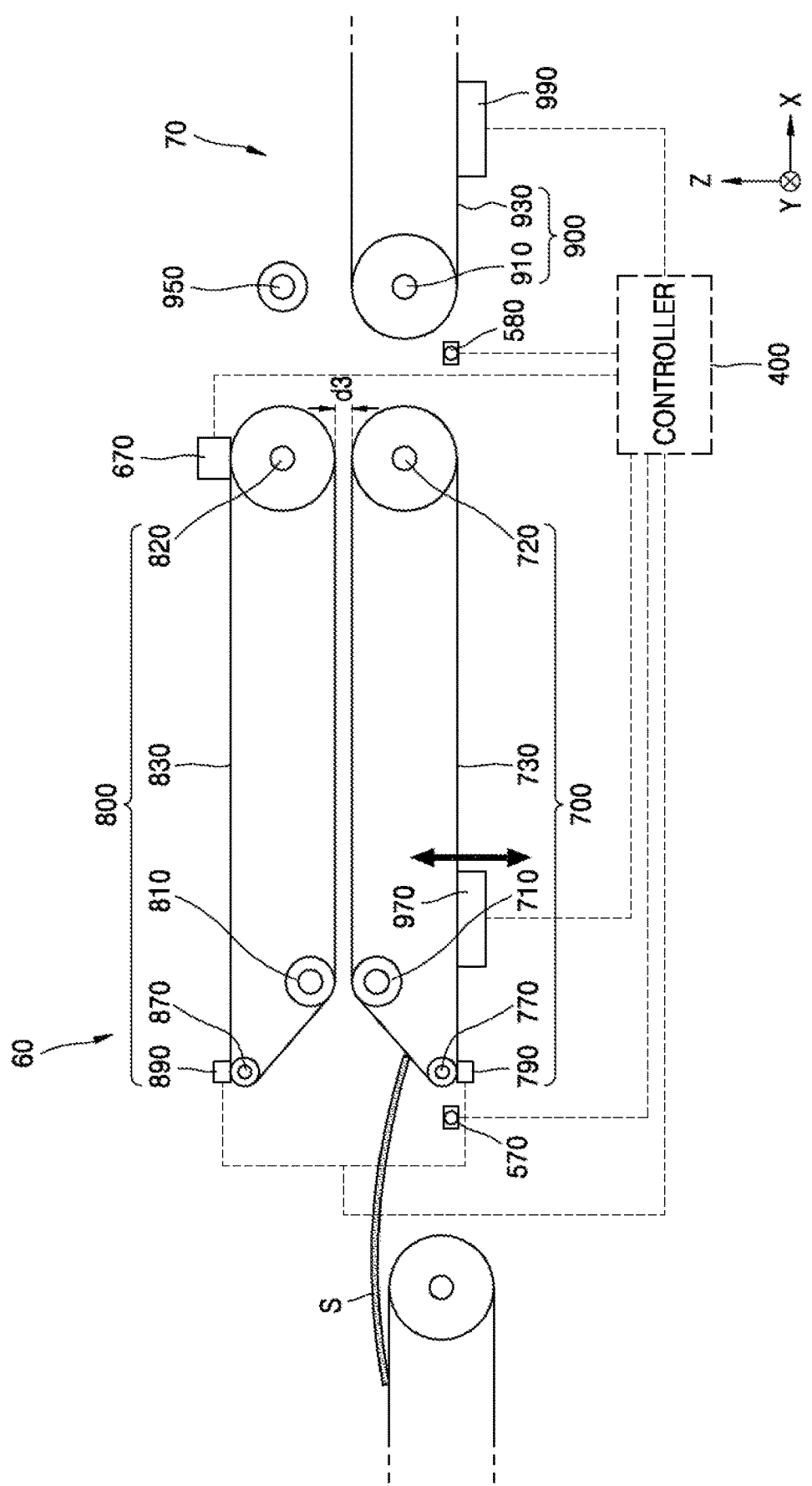

Referring to FIGS. 18 and 20 together, operation S320 may be an operation in which the controller 400 determines whether the substrate S is normally carried in into the fifth transfer apparatus 60. In an example embodiment, in operation S320, when the substrate S is not normally carried into the fifth transfer apparatus 60, the carry-in sensor 570 may generate an abnormal carry-in signal and transmit the abnormal carry-in signal to the controller 400. When the controller 400 receives the abnormal carry-in signal, the controller 400 may determine that the substrate S is not normally carried in into the fifth transfer apparatus 60.

In an example embodiment, when the substrate S is caught in the first lower conveyor belt 700, the carry-in sensor 570 may transmit a first abnormal carry-in signal to the controller 400. Additionally or alternatively, when the substrate S is caught in the first upper conveyor belt 800, the carry-in sensor 570 may transmit a second abnormal carry-in signal to the controller 400.

Operation S330 may be an operation in which the controller 400 swings at least one of the first lower conveyor belt 700 and the first upper conveyor belt 800 through the first swing apparatus 970.

In an example embodiment, when the controller 400 receives the first abnormal carry-in signal, the controller 400 may control the first swing apparatus 970 to swing the first lower conveyor belt 700. Additionally or alternatively, when the controller 400 receives the second abnormal carry-in signal, the controller 400 may control the first swing apparatus 970 to swing the first upper conveyor belt 800.

Figure 21:
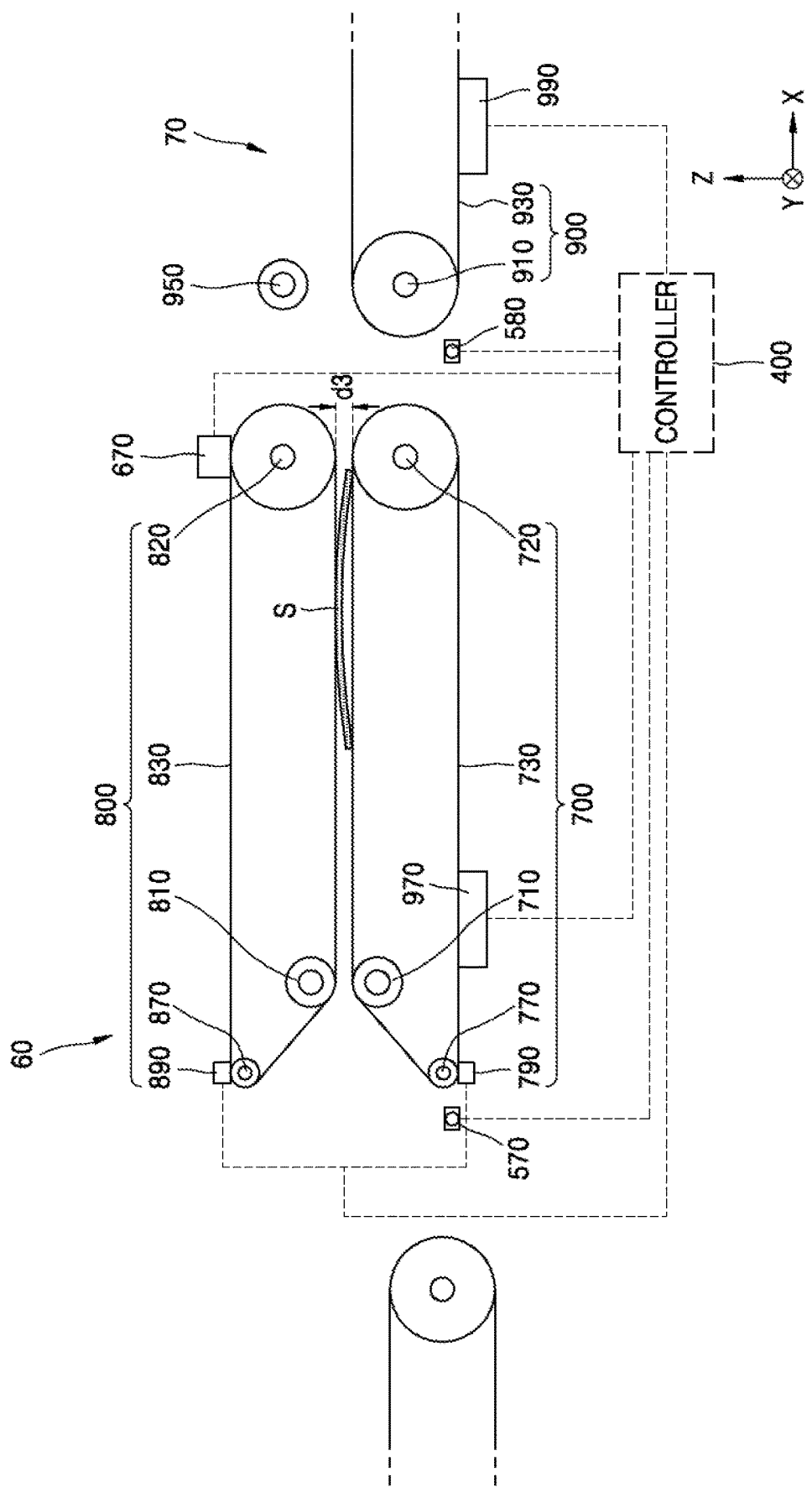

Referring to FIGS. 18 and 21 together, operation S340 may be an operation of transferring the substrate S in the first direction X by the fifth transfer apparatus 60. In operation S320, the first lower conveyor belt 700 may apply upward pressure to the substrate S, and the first upper conveyor belt 800 may apply downward pressure to the substrate S. As a result, while the warped substrate S is transferred in the first direction X by the fifth transfer apparatus 60, the warpage of the substrate S may be increased.

Figure 22:
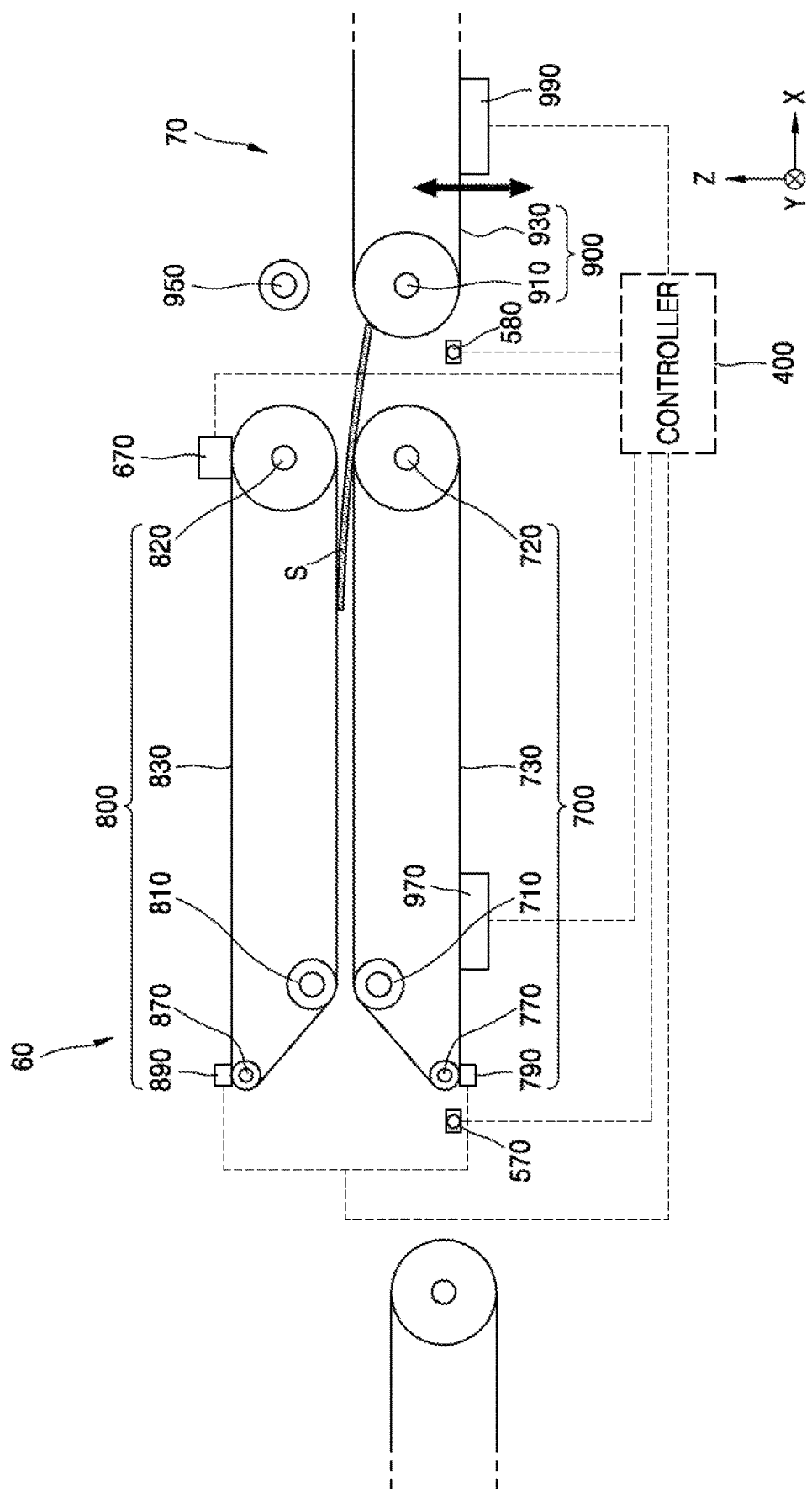

Referring to FIGS. 18 and 22 together, operation S350 may be an operation in which the controller 400 determines whether the substrate S is normally carried in into the sixth transfer apparatus 70. In an example embodiment, in operation S350, when the substrate S is carried out from the fifth transfer apparatus 60 and is not normally carried in into the sixth transfer apparatus 70, the carry-out sensor 580 may generate an abnormal carry-out signal and transmit the abnormal carry-out signal to the controller 400.

When the controller 400 receives the abnormal carry-out signal, the controller 400 may determine that the substrate S is not normally carried in into the sixth transfer apparatus 70. For example, when the substrate S is caught in the second lower conveyor belt 900, the carry-out sensor 580 may transmit the abnormal carry-out signal to the controller 400, and the controller 400 may determine that the substrate S is not normally carried in into the sixth transfer apparatus 70.

Operation S360 may be an operation in which the controller 400 swings the second lower conveyor belt 900 through the second swing apparatus 990. In an example embodiment, when the controller 400 receives the abnormal carry-out signal, the controller 400 may control the second swing apparatus 990 to swing the second lower conveyor belt 900.

Figure 23:
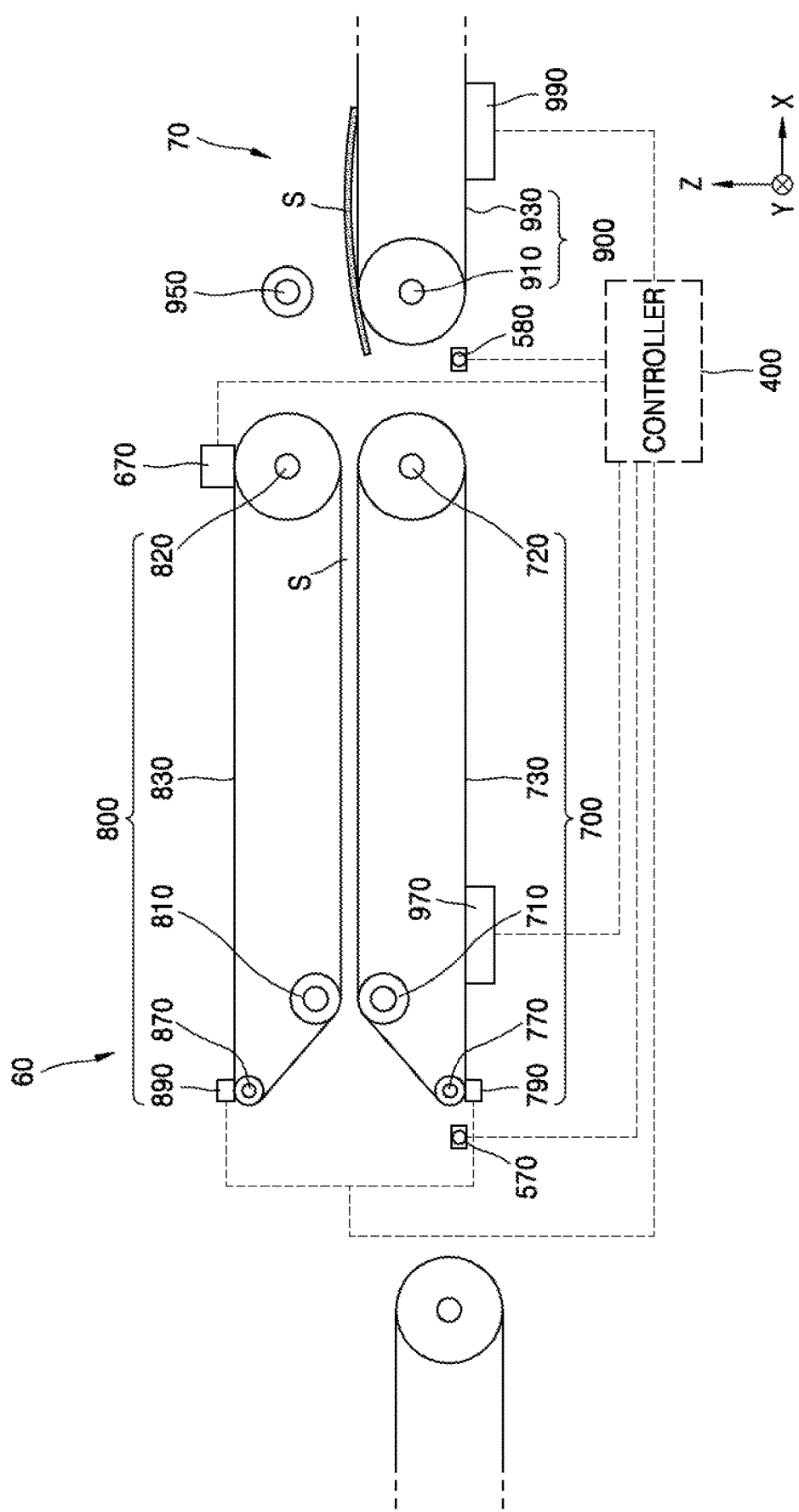

Referring to FIGS. 18 and 23 together, operation S350 may be an operation of transferring the substrate S in the first direction X through the sixth transfer apparatus 70. The substrate S may be carried in into a process chamber through the sixth transfer apparatus 70 for a substrate processing process. However, the inventive concept is not limited thereto, and the substrate S may be carried out from the chamber through the sixth transfer apparatus 70.

The third substrate transfer method S30 according to an example embodiment may prevent a catching phenomenon of the substrate S, thereby improving the substrate transfer speed, and preventing damage to the substrate S. Additionally or alternatively, the third substrate transfer method S30 may transfer the substrate S through the first lower conveyor belt 700 and the first upper conveyor belt 800 configured to apply pressure to the upper and lower portions of the substrate S respectively, thereby reducing the warpage of the substrate S.

While the inventive concept has been particularly shown and described with reference to embodiments thereof, it will be understood that various changes in form and details may be made therein without departing from the spirit and scope of the following claims.

What is claimed is:

1. A substrate transfer apparatus comprising:
   a first transfer apparatus configured to transfer a substrate in a first direction;
   a second transfer apparatus configured to receive the substrate from the first transfer apparatus, the second transfer apparatus comprising a substrate carrier configured to support the substrate and a substrate carrier driver configured to move the substrate carrier;
   a sensor configured to detect an abnormal transfer of the substrate from the first transfer apparatus to the second transfer apparatus and generate a detection signal corresponding to the abnormal transfer of the substrate, and wherein the sensor is further configured to generate different detection signals based on different types of the abnormal transfer of the substrate, respectively;
   a swing apparatus configured to swing the substrate carrier; and
   a controller connected to the sensor and the swing apparatus and configured to control the swing apparatus based on the detection signal of the sensor, wherein the controller is configured to control the swing apparatus to perform different motions to correct the different types of the abnormal transfer, respectively.

2. The substrate transfer apparatus of claim 1, wherein the swing apparatus is further configured to swing the substrate carrier in at least one of a horizontal direction and a vertical direction.

3. The substrate transfer apparatus of claim 1,
   wherein the controller is further configured to control the swing apparatus such that at least one of a vibration direction and a vibration intensity of the substrate carrier is adjusted based on the detection signals.

4. The substrate transfer apparatus of claim 1, wherein the sensor comprises:
   a first sensor mounted on a part of the substrate carrier where the substrate is carried in, wherein the first sensor is configured to generate a normal carry-in signal when the substrate is carried in into the substrate carrier, and to generate an abnormal carry-in signal when the substrate is not carried in into the substrate carrier; and a second sensor mounted on a part of the substrate carrier where the substrate is carried out, wherein the second sensor is configured to generate a normal carry-out signal when the substrate is carried out from the substrate carrier, and to generate an abnormal carry-out signal when the substrate is not carried out from the substrate carrier.

5. The substrate transfer apparatus of claim 4, wherein the first sensor and the second sensor comprise at least one of an optical sensor and a pressure sensor.

6. The substrate transfer apparatus of claim 4, wherein, the controller is further configured to gradually increase an intensity of vibration applied by the swing apparatus to the substrate carrier when the controller receives at least one of the abnormal carry-in signal and the abnormal carry-out signal from the first sensor and the second sensor, respectively.

7. The substrate transfer apparatus of claim 1, wherein the sensor is mounted on a part of the substrate carrier where the substrate is carried in, and is further configured to sense at least one of a collision position and a collision intensity of the substrate and the substrate carrier.

8. The substrate transfer apparatus of claim 7, wherein the sensor is further configured to generate a collision signal based on the collision position and the collision intensity, and the controller is further configured to control the swing apparatus to swing the substrate carrier based on the collision signal.

9. The substrate transfer apparatus of claim 1, wherein the first transfer apparatus comprises a rotation shaft and a main transfer roller coupled to the rotation shaft, and wherein the substrate carrier of the second transfer apparatus comprises a support plate on which the substrate is seated and a guide plate configured to protrude upward from two opposite edges of the support plate to support a side portion of the substrate.

10. A substrate transfer apparatus comprising:

a first transfer apparatus configured to transfer a substrate in a first direction;

a second transfer apparatus configured to receive the substrate from the first transfer apparatus, the second transfer apparatus comprising a substrate carrier configured to support the substrate and a substrate carrier driver configured to move the substrate carrier;

a sensor configured to detect an abnormal transfer of the substrate from the first transfer apparatus to the second transfer apparatus and generate a detection signal corresponding to the abnormal transfer of the substrate, wherein the sensor comprises:

a first sensor mounted on a part of the substrate carrier where the substrate is carried in, wherein the first sensor is configured to generate a normal carry-in signal when the substrate is carried in into the substrate carrier, and to generate an abnormal carry-in signal when the substrate is not carried in into the substrate carrier; and a second sensor mounted on a part of the substrate carrier where the substrate is carried out, wherein the second sensor is configured to generate a normal carry-out signal when the substrate is carried out from the substrate carrier, and to generate an abnormal carry-out signal when the substrate is not carried out from the substrate carrier;

a swing apparatus configured to swing the substrate carrier; and a controller connected to the sensor and the swing apparatus and configured to control the swing apparatus based on the detection signal of the sensor.

11. The substrate transfer apparatus of claim 10, wherein the first sensor and the second sensor comprise at least one of an optical sensor and a pressure sensor.

12. The substrate transfer apparatus of claim 10, wherein, the controller is further configured to gradually increase an intensity of vibration applied by the swing apparatus to the substrate carrier when the controller receives at least one of the abnormal carry-in signal and the abnormal carry-out signal from the first sensor and the second sensor, respectively.

13. A substrate transfer apparatus comprising:

a first transfer apparatus configured to transfer a substrate in a first direction;

a second transfer apparatus configured to receive the substrate from the first transfer apparatus, the second transfer apparatus comprising a substrate carrier configured to support the substrate and a substrate carrier driver configured to move the substrate carrier;

a sensor configured to detect an abnormal transfer of the substrate from the first transfer apparatus to the second transfer apparatus and generate a detection signal corresponding to the abnormal transfer of the substrate, and wherein the sensor is mounted on a part of the substrate carrier where the substrate is carried in, and is further configured to sense at least one of a collision position and a collision intensity of the substrate and the substrate carrier;

a swing apparatus configured to swing the substrate carrier; and a controller connected to the sensor and the swing apparatus and configured to control the swing apparatus based on the detection signal of the sensor.

14. The substrate transfer apparatus of claim 13, wherein the sensor is further configured to generate a collision signal based on the collision position and the collision intensity, and the controller is further configured to control the swing apparatus to swing the substrate carrier based on the collision signal.

* * * * *